United States Patent
Iqbal et al.

(10) Patent No.: US 9,614,699 B2
(45) Date of Patent: Apr. 4, 2017

(54) APPARATUSES AND METHODOLOGIES FOR DECISION FEEDBACK EQUALIZATION USING PARTICLE SWARM OPTIMIZATION

(71) Applicant: KING FAHD UNIVERSITY OF PETROLEUM AND MINERALS, Dhahran (SA)

(72) Inventors: Naveed Iqbal, Dhahran (SA); Azzedine Zerguine, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/066,611

(22) Filed: Mar. 10, 2016

(65) Prior Publication Data

US 2017/0048088 A1 Feb. 16, 2017

Related U.S. Application Data

(60) Provisional application No. 62/204,333, filed on Aug. 12, 2015.

(51) Int. Cl.
H04L 25/03 (2006.01)
H03H 17/02 (2006.01)
(Continued)

(52) U.S. Cl.
CPC ... *H04L 25/03057* (2013.01); *H03H 17/0277* (2013.01); *H04L 25/03108* (2013.01);
(Continued)

(58) Field of Classification Search
CPC ......... H04L 25/03057; H04L 25/03108; H04L 2025/03713; H04L 2025/037; H04L 2025/03732; H03H 17/0277; H04B 7/0413
See application file for complete search history.

(56) References Cited

U.S. PATENT DOCUMENTS 8,346,711 B2 * 1/2013 Al-Duwaish ........ G06N 3/0481
700/28

FOREIGN PATENT DOCUMENTS

CN 101984612 B 12/2010

OTHER PUBLICATIONS

Iqbal et al., "Adaptive equalization using particle swarm optimization for uplink SC-FDMA," in Electronics Letters, vol. 50, No. 6, pp. 469-471, Mar. 13, 2014.*

(Continued)

*Primary Examiner* — Michelle M Koeth
(74) *Attorney, Agent, or Firm* — Oblon, McClelland, Maier & Neustadt, L.L.P.

(57) ABSTRACT

Methods and apparatuses are provided for channel equalization in a communication system. The method includes initializing, using processing circuitry, filter coefficients of an adaptive decision feedback equalizer randomly in a predetermined search space. Further, the method includes updating, using the processing circuitry, the filter coefficients. The filter coefficients are updated using a least mean square recursion when the filter coefficients are stagnant. The filter coefficients are updated using a particle swarm optimization procedure when the filter coefficients are not stagnant. Further, the updating step is repeated until a predetermined stopping criteria is met. Further, the method includes, filtering, using the processing circuitry, a received signal using the filter coefficients.

15 Claims, 25 Drawing Sheets

(51) Int. Cl.
  *H04L 27/01* (2006.01)
  *G06F 7/501* (2006.01)
  *G06F 17/16* (2006.01)
  *H04B 7/0413* (2017.01)

(52) U.S. Cl.
  CPC .............. *G06F 7/501* (2013.01); *G06F 17/16* (2013.01); *H04B 7/0413* (2013.01); *H04L 2025/037* (2013.01); *H04L 2025/03713* (2013.01); *H04L 2025/03732* (2013.01)

(56) References Cited

OTHER PUBLICATIONS

A. Al-Awamia, et al. "A new modified particle swarm optimization algorithm for adaptive equalization", http://www.researchgate.net/profile/A_Zidouri/publication/222555042_A_new_modified_particle_swarm_optimization_algorithm_for_adaptive_equalization/links/00b7528db1179ef24000000.pdf , Mar. 2011, pp. 195-207.

N.Iqbal, et al. "Adaptive equalization using particle swarm optimization for uplink SC-FDMA", https://www.utdallas.edu/~nxa028000/swarm.pdf, Dec. 2013, pp. 1-3.

E.Tugcu, et al. "A novel PSO based blind channel estimation and equalization", http://ieeexplore.ieee.org/xpl/articleDetails.jsp?arnumber=6204630, Apr. 2012, pp. 1-4.

* cited by examiner

APPARATUSES AND METHODOLOGIES FOR DECISION FEEDBACK EQUALIZATION USING PARTICLE SWARM OPTIMIZATION

CROSS REFERENCE

This application claims the benefit of priority from U.S. Provisional Application No. 62/204,333 filed Aug. 12, 2015, the entire contents of which are incorporated herein by reference.

BACKGROUND

In a communication system, a transmitter may send information via a signal to a receiver. The media between the transmitter and the receiver, through which the signal is sent may corrupt the signal. Intersymbol interference (ISI) is one example of a channel effect that may be approximately eliminated using signal processing.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention. The foregoing paragraph has been provided by way of general introduction, and is not intended to limit the scope of the following claims. The described embodiments, together with further advantages, will be best understood by reference to the following detailed description taken in conjunction with the accompanying drawings.

SUMMARY

According to an embodiment of the present disclosure, there is provided a method of a communication system for channel equalization. The method includes initializing, using processing circuitry, filter coefficients of an adaptive decision feedback equalizer randomly in a predetermined search space. Further, the method includes updating, using the processing circuitry, the filter coefficients. The filter coefficients are updated using a least mean square recursion when the filter coefficients are stagnant. The filter coefficients are updated using a particle swarm optimization procedure when the filter coefficients are not stagnant. Further, the updating step is repeated until a predetermined stopping criteria is met. Further, the method includes filtering, using the processing circuitry, a received signal using the filter coefficients.

According to an embodiment of the present disclosure, there is provided a non-transitory computer-readable medium storing instructions which, when executed by at least one processor, cause the at least one processor to perform the above-described method of a communication system for channel equalization.

According to an embodiment of the present disclosure, there is provided a reception apparatus. The reception apparatus comprises circuitry configured to initialize filter coefficients of an adaptive decision feedback equalizer randomly in a predetermined search space. Further, the circuitry is configured to update the filter coefficients. The filter coefficients are updated using a least mean square recursion when the filter coefficients are stagnant. The filter coefficients are updated using a particle swarm optimization procedure when the filter coefficients are not stagnant. Further, the updating step is repeated until a predetermined stopping criteria is met. Further, the circuitry is configured to filter a received signal using the filter coefficients.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
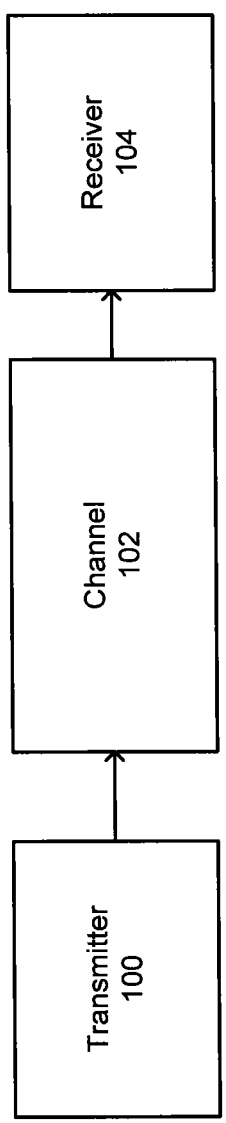
FIG. 1 is a schematic diagram of a communication system according to one example.

Referring now to the drawings, wherein like reference numerals designate identical or corresponding parts throughout several views, the following description relates to apparatuses and associated methodologies for decision feedback equalization based on Particle Swarm Optimization (PSO).

Decision feedback equalization (DFE) is an effective Inter-Symbol Interference (ISI) mitigation technique and can significantly outperform linear equalization (LE) on highly-dispersive channels as described in N. Al-Dhahir and J. Cioffi, "MMSE decision-feedback equalizers: finite-length results," IEEE Transactions on Information Theory, Vol. 41, no. 4, pp. 961-975, July 1995. Adaptive equalization is attractive for time-varying channels, and for this purpose, adaptive algorithms, e.g., the Least Mean Square (LMS) and the Recursive Least Squares (RLS) are widely used as described in S. Haykin, Adaptive filter theory, $4^{th}$ ed. Prentice Hall, 2002. Recently, heuristic techniques applied to equalization/estimation problems showed significant improvement over conventional algorithms as described in D. J. Krusienski and W. K. Jenkins, "The application of particle swarm optimization to adaptive IIR phase equalization," International Conference on Acoustics, Speech, and Signal Processing (ICASSP), pp. 693-696, 2004, H. H. E. Morra, A. U. Sheikh, and A. Zerguine, "Application of Heuristic Algorithms for Multiuser Detection," International Conference on Communications, ICC-2006, pp. 3157-3161, 2006, H. Liu and J. Li, "A particle Swarm Optimization-Based Multiuser Detection for Receive-Diversity-Aided STBC Systems," IEEE Signal Processing Letters, vol. 15, no. 3, pp. 29-32, 2008, and A. T. Al-Awami, A. Zerguine, L. Cheded, A. Zidouri, and W. Saif, "A new modified particle swarm optimization algorithm for adaptive equalization," Digital Signal Processing, vol. 21, no. 2, pp. 195-207, March 2011, incorporated herein by reference in its entirely. The application of PSO to an adaptive linear equalizer provides fast convergence compared to its LMS-based counterpart.

The PSO is a robust algorithm with fast convergence. It is simple, very easy to code, and has low memory requirements. It can be used to solve multi-modal, non-differential, and nonlinear problems as described in J. Kennedy and R. Eberhart, "Particle Swarm Optimization," Intl. Conf. Neural Networks, pp. 1942-1948, 1995. The PSO uses position and velocity update equations to search for a global minimum. Each particle uses its own information and its neighbors information to adjust its position within a search space. In addition, the PSO works based on cooperation among the particles as opposed to the other Evolutionary Algorithms (EA). The PSO has demonstrated its distinguished performance in many engineering applications. PSO applications to image processing has been described in T. Ji, Z. Lu, and Q. Wu, "Optimal soft morphological filter for periodic noise removal using a particle swarm optimizer with passive congregation," Signal Processing, vol. 87, no. 11, pp 2799-2809, November 2007, channel prediction as described in C. Potter, G. K. Venayagamoorthy, K. Kosbar, "RNN based MIMO channel prediction," Signal Processing, vol. 90, no. 2, pp. 440-450, February 2010, and nonlinear active noise control systems as described in N. V. George and G. Panda, "Advances in active noise control: A survey, with emphasis on recent nonlinear techniques," Signal Processing, Vol. 93, no. 2, pp. 363-377, February 2013.

The PSO is used to optimize real and continuous-valued functions in an l-dimensional space. The particles constitute a swarm, also known as population, and move in a pre-defined search space. The position of each particle within the search space represents a possible solution to a problem. The position represents the weights (coefficients) of an equalizer as described further below.

The PSO may be vulnerable to local minima, i.e., the particles become stagnant around the local minima and may not be able to reach the global minimum as described in Y. Chi, F. Sun, L. Jiang, C. Yu, and P. Zhang, "Elastic Boundary for Particle Swarm Optimization," International Conference on Swarm intelligence, pp. 125-132, 2012. In the present disclosure, a hybrid of PSO and LMS algorithms is used, which not only solves the problem of particle stagnancy but also reduces the number of computations required in the PSO.

Another disadvantage of PSO is that it assumes real-valued data. For example, a channel impulse response may be complex for pass-band transmission then the taps weights of the equalizer become complex. The method described herein uses a modified PSO algorithm to handle the complex case without increase in complexity.

To further reduce the complexity, a fast PSO-LMS-DFE is described herein. Since the major complexity factor in the PSO is the convolution operation required to find the equalizer output, the PSO-LMS-DFE described herein, performs the convolution operation in the frequency-domain using the FFT to minimize computations.

The methodologies described herein may be used in a Multiple-Input Multiple-Output (MIMO) system.

Due to its high computational complexity, the most challenging task in designing the MIMO receiver is its corresponding MIMO channel equalizer. A MIMO equalizer has to deal with the inter symbol and the inter stream interference. Several works proposed different methods for adaptive MIMO DFE. Among them, the Vertical Bell Labs layered space-time (V-BLAST) architecture as described in G. Foschini, G. Golden, R. Valenzuela, and P. Wolniansky, "Simplified processing for high spectral efficiency wireless communication employing multi-element arrays," IEEE Journal on Selected Areas in Communications, vol. 17, no. 11, pp. 1841-1852, 1999. Computationally efficient V-BLAST techniques have been proposed when a channel is known as described in B. Hassibi, "An efficient square-root algorithm for BLAST," International Conference on Acoustics, Speech, and Signal Processing, pp. 11737-11740, 200, S. Blostein, "Modified decorrelating decision-feedback detection of BLAST space-time system," International Conference on Communications, pp. 335-339, 2002, and H. Zhu, Z. Lei, and F. Chin, "An improved Square-root algorithm for BLAST," IEEE signal Processing Letters, vol. 11, no. 9. pp. 772-775, September 2004. Applying V-BLAST techniques to time varying channels is difficult due to the frequent estimation of the MIMO channel.

An adaptive MIMO equalizer based on V-BLAST and a generalized DFE has been described in G. Ginis and J. Cioffi, "On the relation between V-Blast and the GDFE", IEEE communications letters, vol. 5, no. 9, pp. 364-366, September 2001, and Y. Lee, "Adaptive MIMO decision feedback equalization for receivers with time-varying channels," IEEE Transactions on Signal Processing, vol. 53, no. 11, pp. 4295-4303, November 2005, where the symbol detection order as well as the equalizer taps are updated recursively; however, this structure suffers from numeric instability. To address numeric instability, a technique based on square-root factorization of the equalizer input correlation matrix was described in A. Rontogiannis, V. Kekatos, and K. Berberidis, "A Square-root Adaptive V-BLAST Algorithm for Fast Time-Varying MIMO Channels," International Conference on Communications, pp. 3135-3139, 2006.

However, unlike the application of MIMO DFE to time-invariant channels, the application of MIMO DFE to time-varying channels still requires excessive computations for the estimation of the parameters. Another challenging problem with these techniques (e.g., V-BLAST) is that substantial training is required when the equalizer length becomes large (as described in P. Li and R. Murch, "Multiple output selection-LAS algorithm in large MIMO systems," IEEE Communications Letters, vol. 14, no. 5, pp. 399-401, May 2010) and therefore a large number of symbols are needed before the algorithm converges. Algorithms based on reduced rank equalization, as described in V. Tripathi and M. Honig, "Adaptive turbo reduced-rank equalization for MIMO channels," IEEE Transactions on Wireless Communications, vol. 4, no. 6, pp. 2789-2800, November 2005, are less complex and require less training symbols as compared to full rank equalization, while requiring matrix inversion at each iteration. The covariance matrix is estimated iteratively and hence matrix inversion operation is avoided as described in R. C. de Lamare and R. Sampaio-Neto, "Adaptive Reduced-Rank Processing Based on Joint and Iterative Interpolation, Decimation, and Filtering," IEEE Transactions on Signal Processing, vol. 57, no. 7, pp. 2503-2514, July 2009 and R. C. de Lamare and R. Sampaio-Neto, "Adaptive Reduced-Rank Equalization Algorithms Based on Alternating Optimization Design Techniques for MIMO Systems," IEEE Transactions on Vehicular Technology, vol. 60, no. 6, pp. 2482-2494, July 2011.

However, all of the above-mentioned techniques use the RLS algorithm which is often complex to implement and prone to instability in a real time environment. Therefore, PSO-based algorithms can be a substitute to the RLS-based algorithms with moderate complexity and guaranteed stability, as they do not have to calculate the inverse of the autocorrelation matrix of the input signal. Moreover, some algorithms may require more than 150 symbols for the training phase, which is not suitable for frame-based applications, e.g., IEEE 802.11p, where the frame contains less than 150 Orthogonal Frequency Division Multiplexing (OFDM) symbols.

The present disclosure presents a detailed analysis of the adjustment of the PSO parameters to ensure best performance. The superiority of the PSO algorithms is tested on channels with different eigenvalue spreads specifically, in MIMO channels where the performance of the LMS/RLS-DFE can be very bad due to the severe eigenvalue spread problem. Exemplary results demonstrate the performance gain of the method described herein over conventional algorithms.

Figure 23:
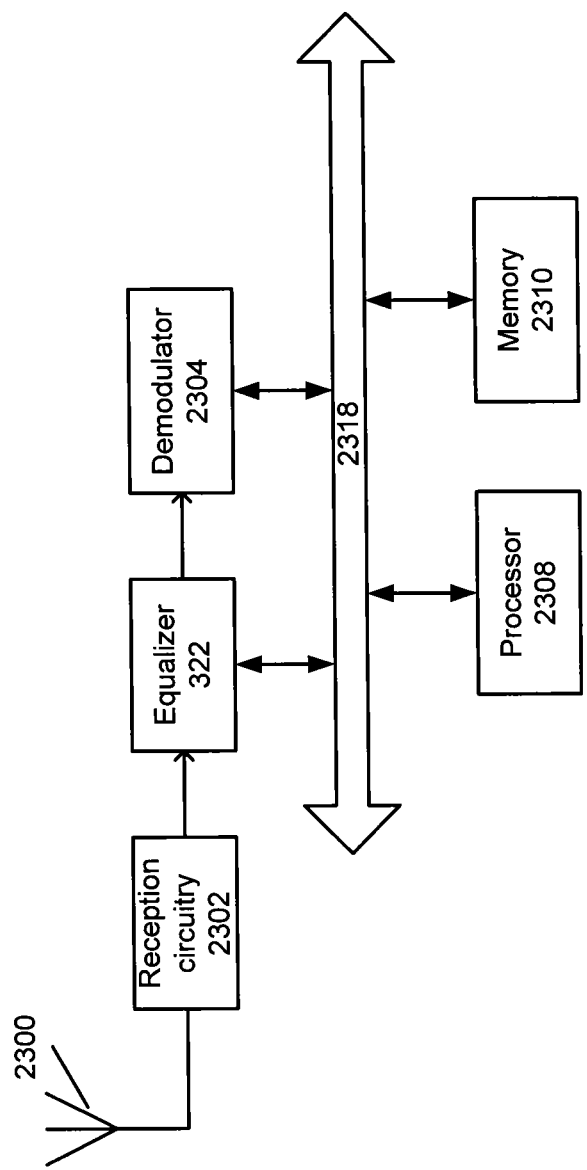
FIG. 23 is a block diagram representation of a receiver according to one example.

FIG. 1 is a schematic diagram of a communication system according to one example. The communication system may include a transmitter 100 and a receiver 104. Data between the transmitter 100 and the receiver 104 is transmitted via a communication channel 102. The transmitter 100 may be any electronic subsystem that produces a modulated signal. The receiver 104 obtains input sample via the communication channel 102 and performs equalization on the input samples to obtain block estimates, which are estimates of transmit blocks (transmitted by the transmitter 100). A data block may be also called a packet, a frame, and so on. In one embodiment, the receiver 104 includes a processor 2308 and a memory 2310, as shown in FIG. 23.

Figure 2:
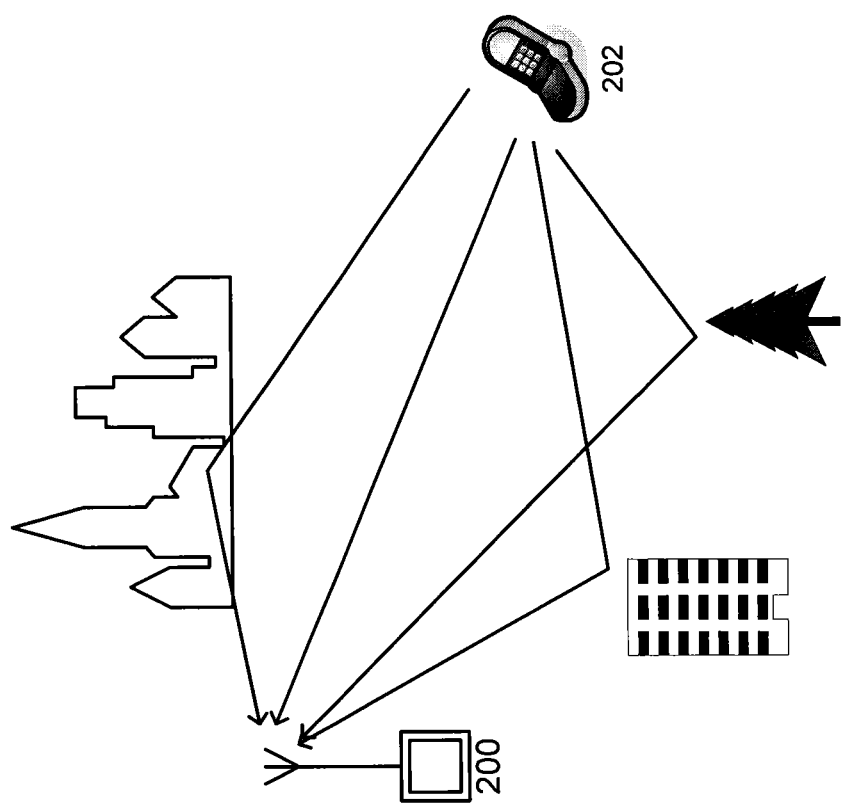
FIG. 2 is a schematic diagram that shows a transmission from a wireless device to a base station according to one example.

FIG. 2 is a schematic diagram that shows a transmission from a wireless device to a base station according to one example. FIG. 2 shows a base station 200 and a wireless device 202. In an uplink transmission system, the transmitter 100 is part of the wireless device 202 and the receiver 104 is part of the base station 200. In other embodiments, the transmitter 100 may be part of the base station 200, and the receiver 104 may be part of the wireless device 202. The base station 200 is typically a fixed station that communicates with the wireless device 202. The wireless device 202 may be fixed or mobile. The wireless device 202 may be a cellular phone, a personal digital assistant (PDA), a wireless modem card, or the like. The wireless device 202 may transmit a signal to the base station 200. The signal may be a radio frequency (RF) signal. The signal may reach the base station 200 in one or more signal paths as shown in FIG. 2. The signals may include a direct path and reflected paths. The reflected paths may be created by reflections from obstacles such as trees, buildings, or other structures. A received RF signal at the base station 200 is a superposition of all received signals at the base station 200.

Figure 3:
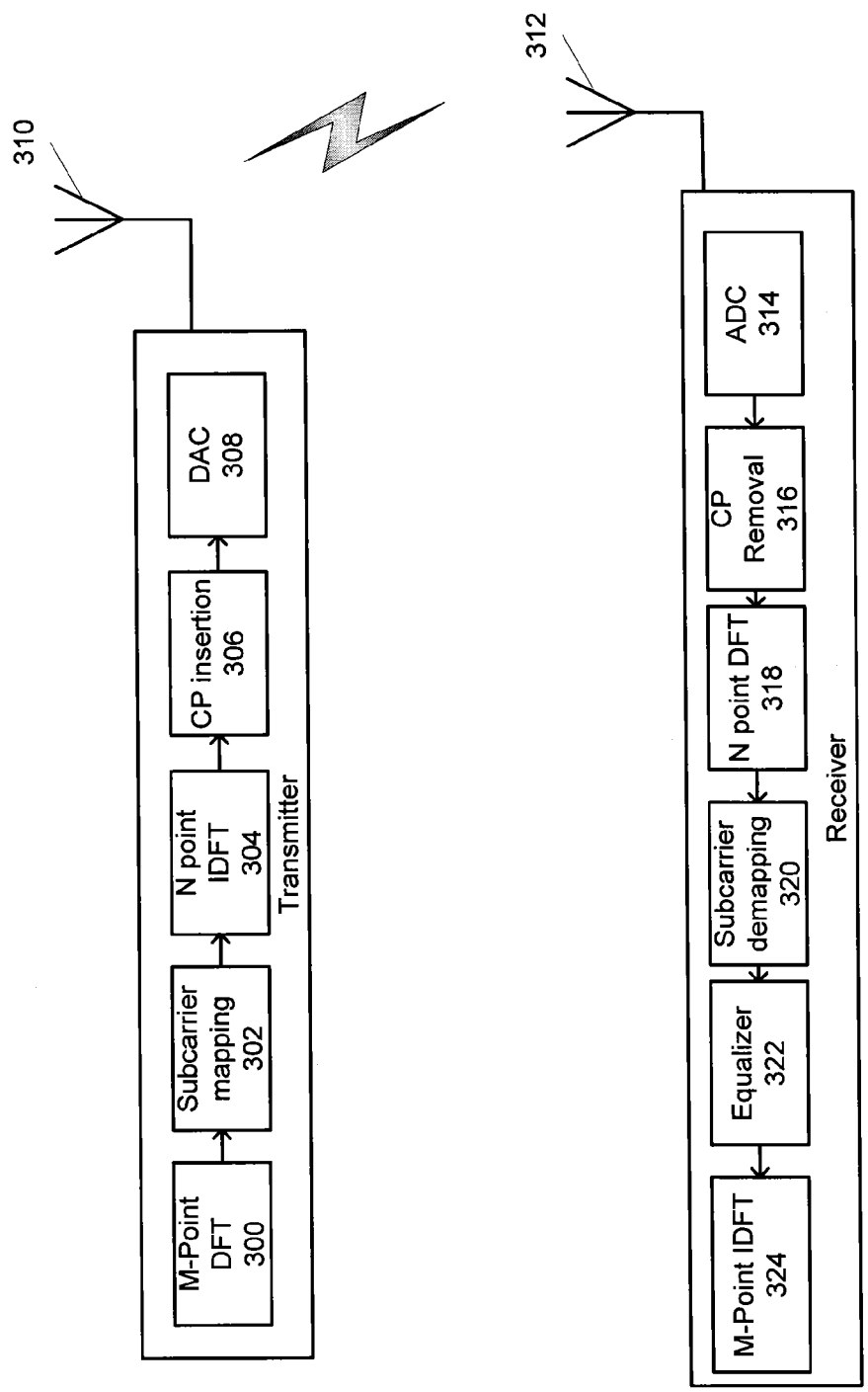
FIG. 3 is a block diagram representation of a transmitter and a receiver according to one example.

FIG. 3 is a block diagram representation of a receiver and a transmitter according to one example. In one embodiment, the communication system may be an uplink SC-FDMA system having K users and a total of N subcarriers, with each user assigned M subcarriers, i.e. N=KM. The transmitter 100 of the SC-FDMA system may include an M-point discrete Fourier transform (DFT) module 300, a subcarrier mapping module 302, an N-point inverse discrete Fourier transform (IDFT) module 304, a cyclic prefix insertion module 306, and a digital to analog converter (DAC) 308. The modulated signal is transmitted by an antenna 310. Each of the modules described herein may be implemented in circuitry that is programmable (e.g. microprocessor-based circuits) or dedicated circuits such as application specific integrated circuits (ASICS) or field programmable gate arrays (FPGAS).

The receiver 104 may include an antenna 312, an analog to digital converter (ADC) 314, a CP (cyclic prefix) removal module 316, an N-point DFT module 318, a subcarrier de-mapping module 320, and a M-point IDFT 324. The receiver 100 also includes an equalizer 322.

The weights of the equalizer 322 are determined based on a PSO algorithm as described further below. In a PSO algorithm, random solutions are assigned to n particles in a d-dimensional search space. The basic PSO algorithm may include the following elements:

Particle position ($p_{i,k}$): The particle position is represented by a real-valued l-dimensional vector which is the potential solution to the problem at hand. The particle position is the weight vector of the equalizer. The position of the $i^{th}$ particle at instant k is denoted by $p_{i,k}=[p_i(0), p_i(1), p_i(2), \ldots, p_i(l)]$, where $p_i(l)$ represents the $i^{th}$ particle position in the $l^{th}$ dimension.

Particle Velocity ($v_{i,k}$): The velocity is also represented by a real-valued l-dimensional vector. The velocity of the $i^{th}$ particle at instant k is given as $v_{i,k}=[v_i(0), v_i(1), v_i(2), \ldots, v_i(l)]$, where $v_i(l)$ represents the $i^{th}$ particle velocity in the $l^{th}$ dimension.

Inertia weight ($i_w$): This parameter controls the change of velocity between successive iterations. It affects the local and global search capabilities of the particles.

Particle or local best ($pbest_{i,k}$): Each particle remembers its best position $pbest_{i,k}$. The best position is the one which results in the minimum (or maximum depending on the problem at hand) value of the cost function.

Global best (gbest$_k$): The best value of all the pbest$_{i,k}$, i=1, 2, ..., n is calculated by comparing the cost function values associated with them. This is the global best gbest$_k$ of the swarm.

Stopping criteria: The algorithm is terminated when the global minimum (or maximum) is attained or after reaching a predefined number of iterations.

The particle velocity is constrained to avoid a possible overflow, i.e., the velocity is restricted as $v_{max}=v_c p_{max}$ where $v_c$ is the velocity constraint factor and $p_{max}$ is the maximum position.

Figure 4:
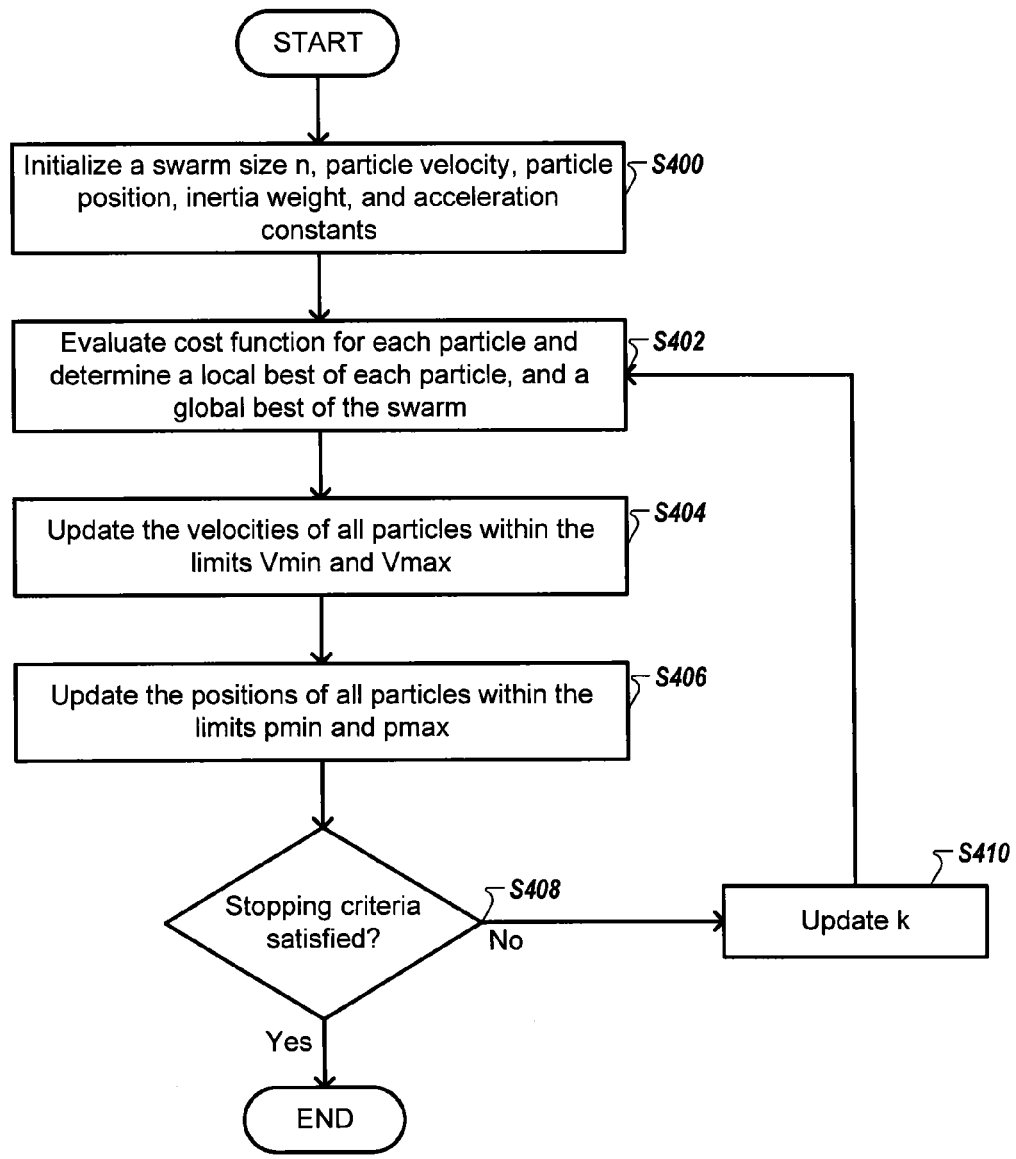
FIG. 4 is a flow chart that shows a Particle Swarm Optimization (PSO) algorithm according to one example.

FIG. 4 is a flow chart that shows a PSO algorithm according to one example. At step S400, a swarm of size n is initialized. At step S402, the cost function is calculated for each particle. The processor 2308 determines a local best of each particle and a global best of the swarm.

At step S404, the velocities of all particles within the limits Vmin and Vmax are updated. In one embodiment, the velocity update equation is given by $$v_{i,k+1} = i_w v_{i,k} + c_1 * rand_1 * (pbest_{i,k} - p_{i,k}) + c_2 * rand_2 * (gbest_k - p_{i,k}), \quad (1)$$

where $c_1$ and $c_2$ are called acceleration constants, i.e., these are the rates at which local and global optima are achieved and $rand_j$, (j=1, 2), is 1×1 dimension vector given as $$rand_j = [rand_{1,j}, rand_{2,j}, \ldots, rand_{1,j}]^T \quad (2)$$

where $rand_{l,j}$ is a uniformly-distributed random number in [0, 1] for the $l^{th}$ dimension.

At step S406, the positions of all particles within the limits pmin and pmax are updated. In one embodiment, the position update equation is given by $$p_{i,k+1} = p_{i,k} + v_{i,k} \quad (3)$$

At step S408, the processor 2308 may check to see whether a stopping criteria is satisfied. For example, the processor 2308 may check whether a counter has reached a predetermined value. In response to determining that the stopping criteria have been satisfied, the process ends. In response to determining that the stopping criteria have not been satisfied, the flow goes to step S410. At step S410, the counter may be updated by an incremental value. Then, the flow goes to step S402.

In one embodiment, the constant inertia weight, $i_w$, in Equation (1) may be decreased linearly at each instant k, as described in Y. Shi and R. Eberhat, "A Modified Particle Swarm Optimizer," international on Evolutionary Computation, pp. 69-73, 1988. The constant inertia may be expressed as:

$$i_w(k) = y i_w(k-1), \quad (4)$$

where y is a weighting factor that controls the diminution of $i_w(k)$.

In one embodiment, a variable constriction factor is introduced in the velocity update equation. The constriction factor based-PSO is described in M. Clerc, "The swarm and the Queen: Towards a Deterministic and Adaptive Particle Swarm Optimization," Congress on Evolutionary Computation, CEC99, pp. 1951-1957, 1999 and R. Eberhat and Y. Shi, "Comparing inertia weights and constriction factors in particle swarm optimization," Congress on Evolutionary Computation, CEC00, pp. 84-88, 2000, to update the particle's velocity. The velocity update equation may be expressed as $$v_{i,k+1} = K(k) * [v_{i,k} + c_1 * rand_1 * (pbest_{i,k} - p_{i,k}) + c_2 * rand_2 (gbest_k - p_{i,k})] \quad (5)$$

and K(k) may be expressed as $$K(k) = \frac{k_c(k)}{|1 - \Phi - \sqrt{\Phi^2 - 4\Phi}|}, \quad (6)$$

where $\Phi$ should be always greater than four and may be expressed as $$\Phi = c_1 + c_2 \quad (7)$$

and $$k_c(k) = k_{min} + (k_{max} - k_{min}) \frac{iter - k}{iter - 1^2} \quad (8)$$

where the variable iter is the maximum number of iterations and k is the current iteration. As the particle gets closer to the global minimum, a lower value of the constriction factor may be used to help stabilizing the algorithm with fast convergence.

In one embodiment, the inertia weight $i_w$ may be updated based on the error value and eventually may result in high speed and efficiency as described in D. Krusienski and W. Jenkins, "A modified Particle Swarm Optimization Algorithm for Adaptive Filtering," IEEE International Symposium on Circuits and Systems, pp. 137-140, 2006. The inertia weight is changed only when a better fit is found in order to move the particle close to the optimum point. The inertia's influence is reduced if it does not reach the lowest estimation error. It maximizes the influence of potentially favorable inertia directions, while minimizing the influence of potentially unfavorable inertia directions. The adaptive inertia weight equation may be expressed as $$i_{wi}(k) = \frac{1}{\left(1 + e^{\frac{-\Delta J_i(i)}{S}}\right)} \quad (9)$$

where $i_{wi}$ is the inertia weight of the $i^{th}$ particle, $\Delta J_i(k)$ is the change in the cost function between the current and the previous iterations, and S is the slope factor. Using Equation (9) limits the inertia weight to the interval [0, 1] with mean of 0.5 which corresponds to no change in the error. It means that an increase in the error leads to an inertia weight to be more than 0.5 and vice versa.

Figure 5:
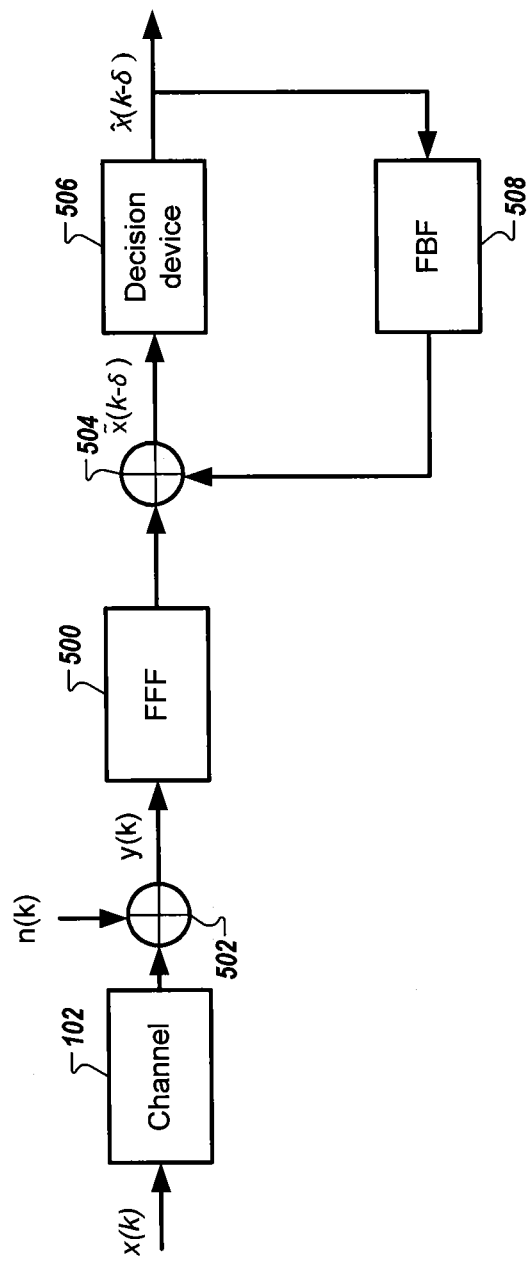
FIG. 5 is a block diagram of a decision feedback equalizer according to one example.

FIG. 5 is a block diagram of a decision feedback equalizer according to one example. The decision feedback equalizer may include a feedforward filter (FFF) 500, a first adder 502, a second adder 504, a decision device 506, and a feedback filter (FBF) 508. The signal from the channel 102 and noise n(k) are added using the first adder 502 and the output is fed to the feedforward filter 500. The output of the feedforward filter 500 is fed to the second adder 504. The output of the second adder 504 is fed to the decision device 506. The output from decision device 506 is fed to the feedback filter 508. The output of the feedback filter is fed to the second adder 504.

In one example, the communication system may be a MIMO system including $N_t$ transmit and $N_r$ receive antennas. In the $N_t \times N_r$ MIMO system, independent and identically distributed data symbols $\{\chi_1(\bullet), \chi_2(\bullet), , \chi_{N_t}(\bullet)\}$ are transmitted from antennas $T_1, T_2, \ldots, T_{N_t}$, respectively, over the multi-channel environment and received by antennas $R_1, R_2, \ldots, R_{N_r}$ after being corrupted by additive white Gaussian noises $\{n_1(\bullet), n_2(\bullet), \ldots, n_{N_r}(\bullet)\}$. $\chi_i(\bullet)$ while travelling through channels $h_{11}, h_{12}, \ldots, h_{1Nr}$ which are the respective impulse responses of the channels between transmit antenna $T_1$ and receive antennas $R_1, R_2, \ldots, R_{Nr}$. Likewise, $\chi_2(\chi)$ travels through channels $h_{21}, h_{22}, \ldots, h_{2Nr}$ which are the respective impulse responses of the channels between the transmit antenna $T_2$ the receive antennas $R_1, R_2, \ldots, R_{Nr}$ and similarly this is the case for the rest of the transmitted signals. Hence, the received signals are not only corrupted by channel and noise but they also interfere with each other. The signals $\{\chi_1(\bullet), \chi_2(\bullet), \ldots, \chi_{Nr}(\bullet)\}$ are assumed to be uncorrelated with each other and with noise.

Figure 6:
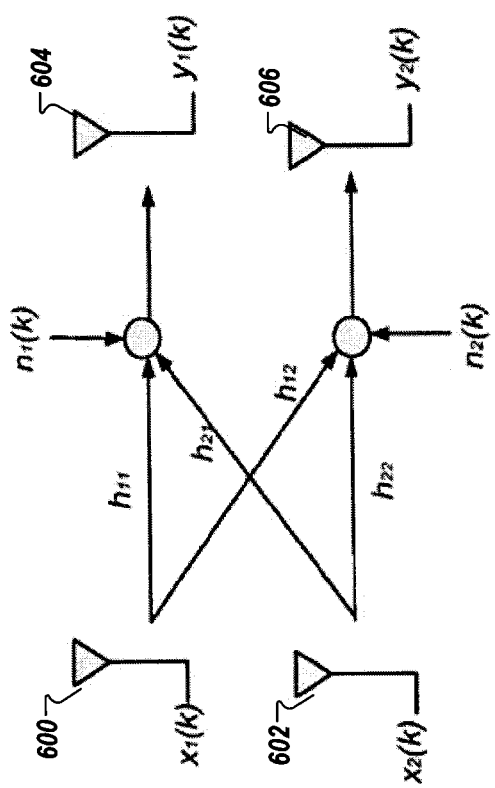
FIG. 6 is a schematic that shows a multiple-input and multiple-output (MIMO) system according to one example.

FIG. 6 is a schematic that shows a 2×2 MIMO system according to one example. The MIMO system includes a first transmit antenna 600, a second transmit antenna 602, a first receive antenna 604, and a second receive antenna 606. A first communication signal may travel from the first transmit antenna 600 to the first receive antenna 604 through channel $h_{11}$ and to the second receive antenna 606 through channel $h_{12}$. A second communication signal may travel from the second transmit antenna 602 to the first receive antenna 604 through channel $h_{21}$ and to the second receive antenna 606 through channel $h_{22}$.

The received signals may be represented by $\{y_1(\bullet), y_2(\bullet), \ldots, y_{Nr}(\bullet)\}$. The vectors of transmitted samples, received symbols and decisions, respectively, at instant k may be expressed as:

$$y(k) \triangleq [y_1(i)y_2(k) \ldots y_{Nr}(k)] \quad (10)$$

$$x(k) \triangleq [x_1(k)x_2(i) \ldots x_{Nr}(k)] \quad (11)$$

$$\hat{x}(k-\delta) \triangleq [\hat{x}_1(k-\delta)\hat{x}_2(k-\delta) \ldots \hat{x}_{Nr}(k-\delta)] \quad (12)$$

where $\hat{\chi}(k-\delta-1)$ is a delayed version of $\hat{\chi}(k)$. At any instant k, the states of the feedforward filter (FEE), $y_k$, and the feedback filter (FBF), $d_k$, may be expressed as $$y_k = [Y(k)y(k-1) \ldots y(k-N_f+1)] \quad (13)$$

$$d_k = \begin{cases} [x(k-\delta-1) \ldots x(k-\delta-N_b)], & \text{for training} \\ [\hat{x}(k-\delta-1) \ldots \hat{x}(k-\delta-N_b)], & \text{for decision directed} \end{cases} \quad (14)$$

The received vector $y_k$ is fed into the feedforward filter 500 with $N_f$ matrix taps each of dimension $N_r \times N_r$. Similarly, the decisions are fed into the feedback filter 508 with $N_b$ matrix taps each of dimension $N_r \times N_r$. The input to the decision device 506 may be expressed as $$\hat{x}(k) = y(k)F_0 y(k-1)F_1 \ldots + y(k-N_f+1)F_{Nf-1}$$
$$-\hat{x}(k-\delta)B_0 - \hat{x}(k-\delta-1)B_1 \ldots -\hat{x}(k-\delta-N_b+1)B_{Nb-1} \quad (15)$$

where $F_0, F_1, \ldots, F_{Nf-1}$ and $B_0, B_1, \ldots, B_{Nb-1}$ are the matrix coefficients of the feedforward and feedback filters respectively.

For the decision-directed mode, $\hat{\chi}(k-\delta) = \chi(k-\delta)$, the columns of $F_0(B_0)$ may be dennoted by $F_{0,1}$ ($B_{0,1}$), $F_{0,2}$ ($B_{0,2}$), ... $F_{0,Nr}$ ($B_{0,Nr}$) and likewise for other matrix coefficients of the feedforward filter 500 and feedback filter 508. Let $W_{r,k}$, (r=1, 2, ..., Nr) be the vector comprised of the $r^{th}$ column of matrix taps of feedforward and feedback filters at instant k and may be expressed as $$W_{r,k} \triangleq [F_{0,r}^T F_{1,r}^T \ldots F_{Nf-1,r}^T B_{0,r}^T B_{1,r}^T \ldots B_{Nb-1,r}^T]^T \quad (16)$$

where $(\bullet)^T$ represents the transpose operation. Equation (15) may be expressed as follows $$\hat{x}_r(k) = [y_k - d_k]W_{r,k-1} \quad (17)$$

The error signal may be expressed as $$e_r(k) = \begin{cases} \hat{x}_r(k-\delta) - \check{x}_r(k), & \text{for decision directed} \\ x_r(k-\delta) - \check{x}_r(k), & \text{for training} \end{cases} \quad (18)$$

In the present disclosure, the PSO is used to search for the tap weights that minimize the Mean Square Error (MSE). The PSO is more effective when applied on the whole data but due to the non-availability of the whole data in the system, a block of data (with size N) may be used and, hence, the objective function in every iteration is the calculated MSE, which may be expressed for the $i^{th}$ particle at the $k^{th}$ iteration as $$J_{ri}(k) = \frac{1}{N}\sum_{j=1}^{N} |\{e_r(k)\}_{ji}|^2, r = 1, 2, \ldots, N_r \quad (19)$$

where $\{e_r(k)\}_{ji}$ is the jth error samples of ith particle for $\chi_r(k)$.

Although the methodology described herein describes a MIMO system, the methodology described herein may be applied to a SISO system.

In PSO, the particles may become stagnant due to the lack of finer search capabilities in the PSO algorithm. Hence, achieving the global minimum value of cost function may not be possible. In addition, PSO enjoys fast convergence but its complexity is high and its computations depend on the size of swarm and the convolution operation required to find the equalizer output.

For these reasons, a hybrid PSO, i.e., a combination of PSO and LMS may be used. A combination of PSO and LMS to combat the stagnation problem is described in D. Krusienski and W. Jenkins, "A particle swarm optimization—least mean squares algorithm for adaptive filtering," Conference Record of the Thirty-Eighth Asilomar Conference on Signals, Systems and Computers, 2004, vol. 1, pp. 241-245, 2004. The particle position update equation is modified by adding an LMS gradient term that increases the computational cost. The influence of LMS on PSO remains constant throughout the iterations. Thus, the overhead is also increased due to adding scaling factors for controlling the effect of both algorithms on the particle's position update equation.

These difficulties have been overcome in this disclosure by separately using the two algorithms at different times i.e. LMS, with small step size, takes over when the particles become stagnant otherwise PSO is used as further described herein.

The operation of PSO-LMS algorithm is as follows. Initially, the PSO algorithm with variable constriction factor is used for global search to explore the search space and fast convergence. As the gbest$_k$ of the particles become stagnant, the LMS recursion is used to update the particle position to find the minimum point locally in the search space. In this way, whenever the particles become stagnant the LMS gives them direction towards the global minimum. If there is any disturbance e.g. channel changes or SNR changes, then PSO takes over the LMS since gbest$_k$ becomes disturbed.

Figure 7:
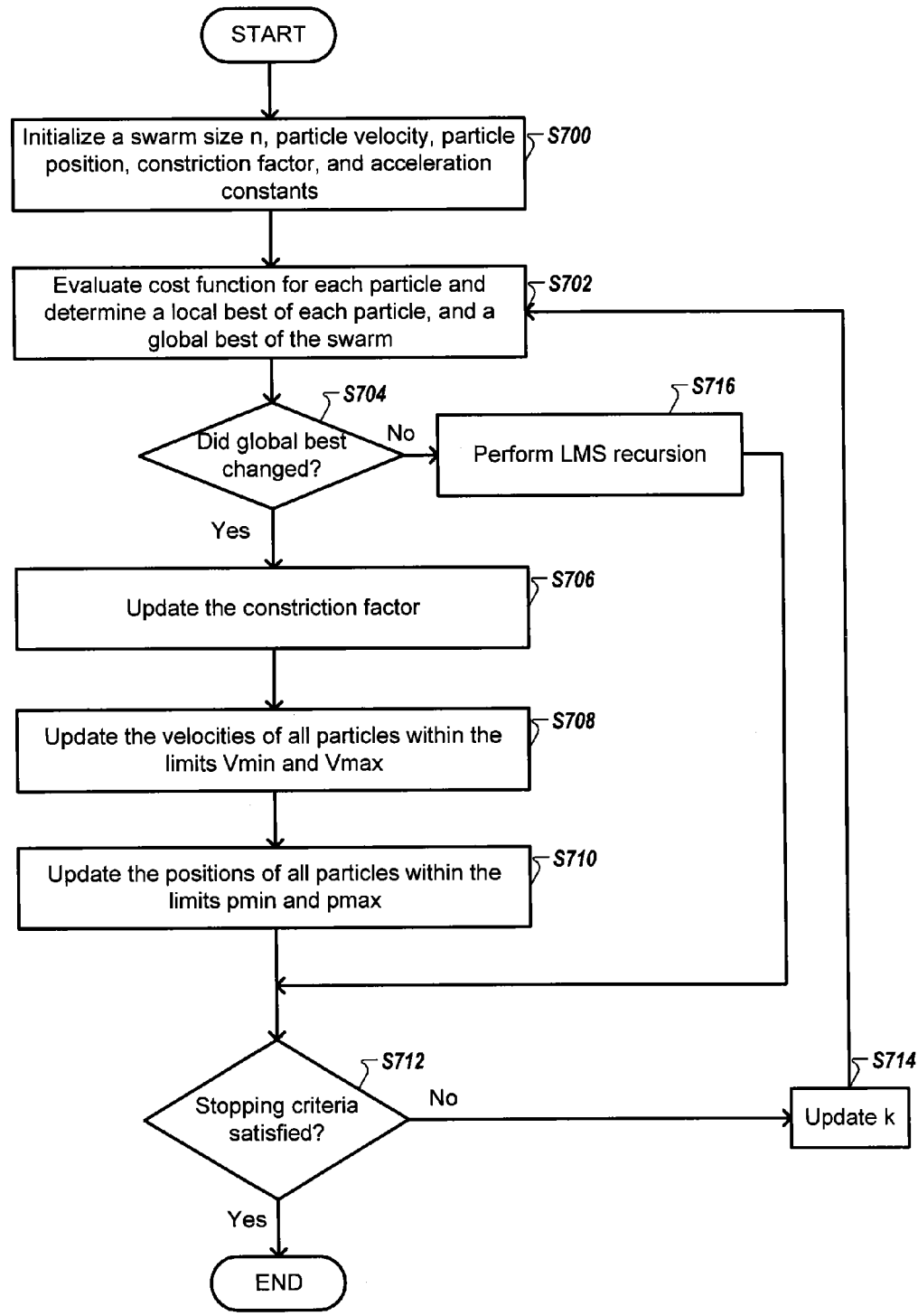
FIG. 7 is a flow chart that shows a method to determine a weight vector of an equalizer using a PSO-LMS (Least Mean Square) algorithm according to one example.

FIG. 7 is a flow chart for a method to determine a weight vector of an equalizer using a PSO-LMS algorithm according to one example.

At step S700, the process starts by initializing positions of n particles of l dimensions such that the coefficients $p_i(j)$, j=1, 2, ... l of the $i^{th}$ particle are uniformly distributed in the range $[p_{min}, p_{max}]$, where $p_{min}=-p_{max}$. The particle positions are the weights of the equalizer. In the same way, the velocities are initialized such that the velocity coefficients $v_i(j)$, $j=1, 2, \ldots l$ are also uniformly distributed in the range $[v_{min}, v_{max}]$, where $v_{min}=-v_{max}$.

At step S702, the cost function is calculated. In one example, the Mean Square Error (MSE) for each particle for SISO/MIMO case may be calculated using Equation (19). Then, the local best of each particle is found.

For the first iteration, the local best position (pbest$_{i,k}$) of $i^{th}$ article is set to the current particle position ($p_{i,0}$) and its best MSE $J_{i,best}(k)$ to the corresponding MSE value $J_i(0)$. For the remaining iterations, the processor 2308 checks whether $J_i(k)<J_{i,best}(k-1)$, then sets $J_{i,best}(k)=J_i(k)$ and pbest$_{i,k}=p_{i,k}$. In response to determining that $J_i(k)$ is greater than $J_{i,best}(k-1)$, then $J_{i,best}(k)=J_{i,best}(k-1)$ and pbest$_{i,k}$=pbest$_{i,k-1}$.

Then, the global best is determined. The minimum MSE $J_{min}(k)$ among all the particles best MSE $J_{i,best}(k)$, $i=1, 2, \ldots, n$ is the global best MSE $J_{min,best}$ and the corresponding position is the global best position gbest$_k$. For any k>0, if $J_{min}(k)<J_{min,best}(k-1)$, then $J_{min,best}(k)=J_{min}(k)$ and gbest$_k$=$p_{k,min}$, where $p_{k,min}$ is the position of that particle corresponding to $J_{min,best}(k)$; else $j_{min,best}(k)=J_{min,best}(k-1)$ and gbest$_k$=gbest$_{k-1}$.

At step S704, the processor 2308 may check to see whether the global best has changed. Particles become stagnant as they get closer to the global minimum. At this stage, the current value of the global best becomes the same as its prior value i.e. gbest$_k$=gbest$_{k-1}$. In one embodiment, the condition to check the stagnancy is to compare the current local best positions of all the particles with their previous local best positions. In other embodiments, only global values are compared. In response to determining that particles are stagnant, then the flow goes to S716. In response to determining that the particles are not stagnant, the flow goes to step S706. At step S706, the constriction factor is updated. In one example, the constriction factor may be updated using Equation (6).

At step S708, the velocity of each particle is updated. In one example, the velocity of each particle is updated according to Equation (5) using the current particle velocity, local best of particle pbest$_{i,k}$ and global best value gbest$_k$. The coefficients $v_i(l)$, $j=1, 2, \ldots d$ are restricted in the range $[-v_{max}, v_{max}]$.

At step S710, the position of each particle is updated. In one example, the position of each particle is updated according to Equation (3) using the velocity value calculated in step S708. The coefficients $p_i(j)$, $j=1, 2, \ldots d$ are restricted in the range $[-p_{max}, p_{max}]$. Then, the flow goes to step S712.

At step S712, the processor 2308 may check whether the maximum number of iterations has been reached. For example, the processor 2308 may check whether the counter has reached a predetermined value. In response to determining that the maximum number of iterations has been reached, the process ends. In response to determining that the maximum number of iterations has not been reached, the flow goes to step S714.

At step S714, the counter is updated by an incremental value. For example, the time instant counter may be updated as k=k+1, then the flow goes to step S702.

At step S716, when the particles are stagnant, then the block LMS recursion is used to update the position of each particle. For block LMS, the equalizer input matrix may be expressed as $$Y_k \triangleq \begin{pmatrix} y(k) & \ldots & y(k-N_f+1) \\ \vdots & \ddots & \vdots \\ y(k+N-1) & \ldots & y(k+N-N_f) \end{pmatrix} \quad (20)$$

and the decision matrix as $$D_k \triangleq \begin{pmatrix} d(k-1) & \ldots & d(k-N_b) \\ \vdots & \ddots & \vdots \\ d(k+N-2) & \ldots & d(k+N-N_b-1) \end{pmatrix} \quad (21)$$

where $d(k)$ is the decision on the symbol $\check{\chi}(k)$ for the decision-directed mode and $\chi(k)$ for the training mode. In one example, the delay $\delta$ may be ignored.

The output of the equalizer is given as $$\check{x}k = Y_k f_{k-1} + D_l b_{k-1} \quad (22)$$

where $$\check{x}_k = [\check{x}(k) \ldots \check{x}(K+N-1)] \quad (23)$$

The error at output of the equalizer is given as $$e(k) = d_k - \check{x}_k \quad (24)$$

where $$d_k = [d(k) \ldots d(k+N-1)] \quad (25)$$

Now, the LMS update equation for SISO case may be expressed as $$P_{i,k+1} = p_{i,k} + \mu A_k^T e_i(k) \quad (26)$$

where $\mu$ is the step size and $e_i(k)$ is calculated using (24) for the $i^{th}$ particle and $A_k$ may be expressed as $$A_k = \begin{bmatrix} Y_k^H \\ D_k^H \end{bmatrix} \quad (27)$$

Then, the flow goes to step S712.

The PSO algorithm works on real numbers. Using PSO to find the optimum weights for complex-valued data is not possible without modification. One approach is to use PSO separately on the real and imaginary parts (or on the magnitude and phase) or double the dimensions and use first the d dimensions for the real part and the rest for imaginary part. However, this increases the complexity. To avoid this, the PSO algorithm is modified as described below.

Figure 8:
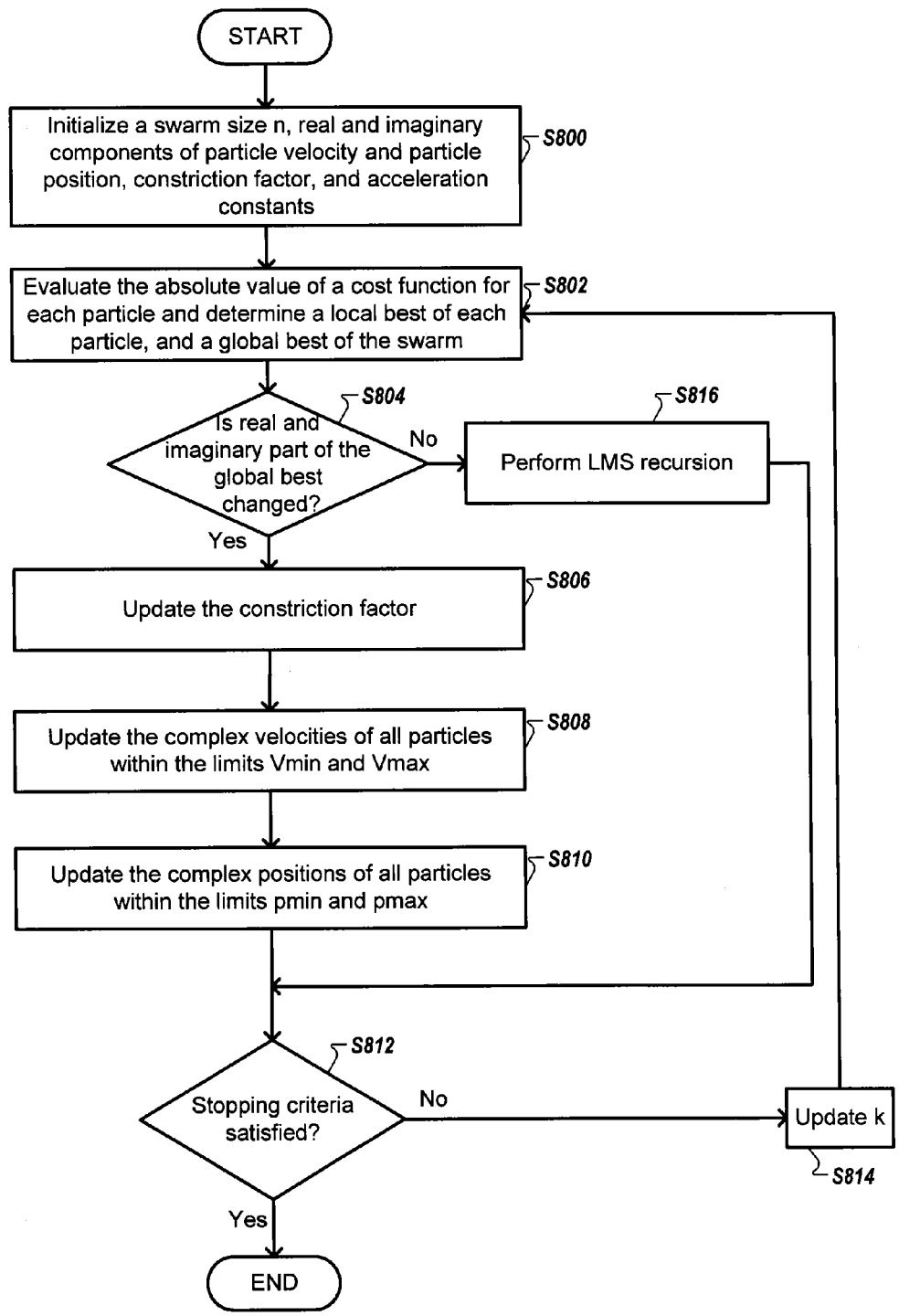
FIG. 8 is a flow chart that shows a method to determine a weight vector of an equalizer using a PSO-LMS algorithm for complex valued data according to one example.

FIG. 8 is a flow chart for a method to determine a weight vector of an equalizer using a PSO-LMS algorithm for complex valued data according to one example.

At step S800, the position $p_{i,k}$ and the velocity $v_{i,k}$ of the $i^{th}$ particle may be complex. At k=0, m particles of l complex dimensions are initialized, such that the real and imaginary components of coefficients of position $p_i(l)$, $j=1, 2, \ldots l$ of the $i^{th}$ particle are uniformly distributed in the range $[p_{im,max}, p_{max}]$ and $[p_{re,min}, p_{re,max}]$ respectively, where $p_{re,max}=p_{im,max}=p_{max}$ and $p_{re,min}=-p_{max}$. In the same way, the real and imaginary components of velocity coefficients $v_i(l)$, $j=1, 2, \ldots l$ of $i^{th}$ particle are also uniformly distributed in the range $[v_{re,min}, v_{re,max}]$ and $[v_{im,min}, v_{im,max}]$ respectively, where $v_{re,max}=v_{im,max}=v_{max}$ and $v_{re,min}=v_{im,min}=-v_{max}$.

At step S802, the absolute value of the MSE for each particle is calculated. Then, the processor compares the absolute values of $|J_i(k)|$ and $|J_{i,best}(k-1)|$. In response to determining that $|J_i(k)|<|J_{i,best}(k-1)|$ for i=1, 2, 3, . . . , m, then $J_{i,best}(k)=J_i(k)$ and pbest$_{i,k}$=−P$_{i,k}$. In response to determining that $|J_i(k)|<|J_{i,best}(k-1)|$, then $J_{i,best}(k)=J_{i,best}(k-1)$ and pbest$_{i,k}$=pbest$_{i,k-1}$. Then, the processor 2308 compares the absolute values of $|J_{min}(k)|$ and $J_{min.best}(k-1)|$. In response to determining that $|J_{min}(k)|<J_{min.best}(k-1)|$, then $J_{min,best}(k)=J_{min}(k)$ and gbest$_k$=p$_{i,k,min}$. In response to determining that $|J_{min}(k)|>J_{min.best}(k-1)|$, then $J_{min,best}(k)$ is not changed: $J_{min.best}(k)=J_{min.best}(k-1)$ and gbest$_k$=gbest$_{k-1}$.

At step S804, the processor 2308 may check to see whether the global best has changed. Particles become stagnant as they get closer to the global minimum. The current value of the global best becomes the same as its prior value i.e. gbest$_k$=gbest$_{k-1}$. In one embodiment, the condition to check the stagnancy is to compare the current local best positions of all the particles with their previous local best positions. The real and imaginary parts of current value of global best are compared with the real and imaginary parts of the previous value of the global best. In other embodiments, only global values are compared. In response to determining that particles are stagnant, the flow goes to S816. In response to determining that the particles are not stagnant, the flow goes to step S806.

At step S806, the constriction factor is updated. In one example, the constriction factor may be updated using Equation (6).

At step S808, the complex velocity of each particle is updated by using the velocity update equation. The real and imaginary components of velocity coefficients $c_i(l)$, j=1, 2, . . . l are restricted in the range $[-v_{max}, v_{max}]$.

At step S810, the complex position of each particle is updated. The real and imaginary components of the position coefficients $p_i(l)$, j=1, 2, . . . , l are in the range $[-p_{max}, p_{max}]$. Then, the flow goes to step S812.

At step S812, the processor 2308 may check whether a stopping criteria is met. For example, the processor 2308 may check whether the counter has reached a predetermined value or a global minimum is reached. In response to determining that the maximum number of iterations has been reached, the process ends. In response to determining that the maximum number of iterations has not been reached, the flow goes to step S814.

At step S814, the counter is updated by an incremental value. For example, the time instant counter may be updated as k=k+1, then the flow goes to step S802.

At step S816, when the particles are stagnant then the block LMS recursion is used to update the position of each particle.

Figure 9:
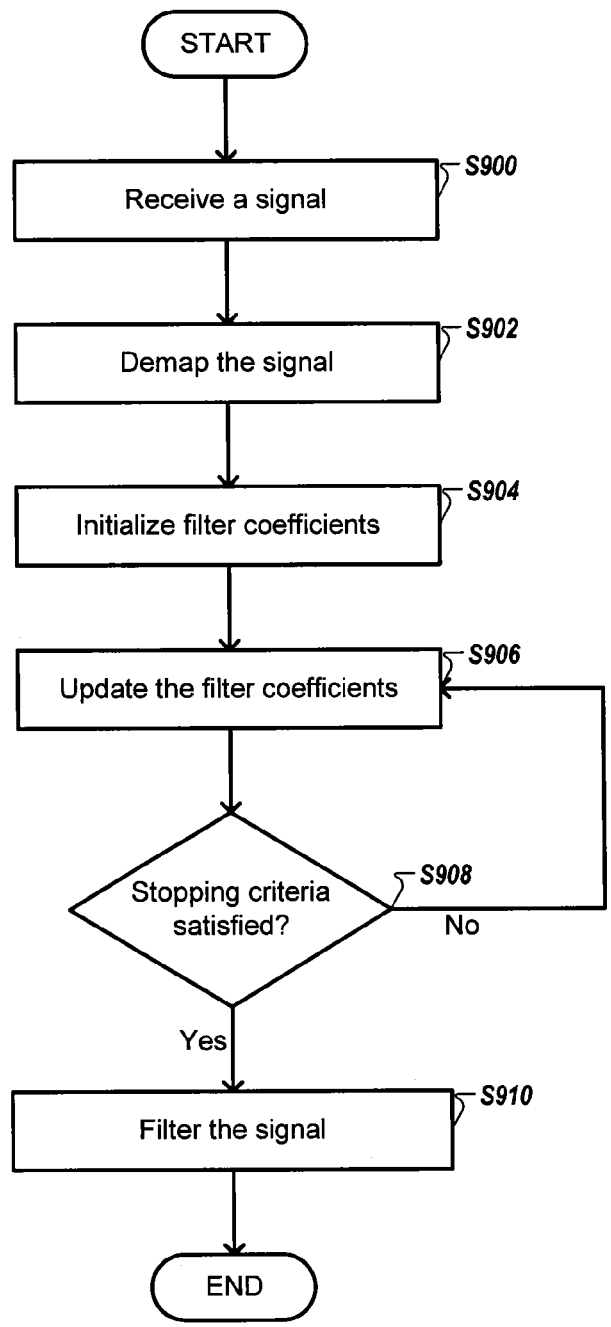
FIG. 9 is a flow chart that shows a method for determining filter coefficients of a PSO based decision feedback equalizer according to one example.

FIG. 9 is a flow chart that shows a method for determining filter coefficients of decision feedback equalizer according to one example. At step S900, the receiver 104 may detect a signal. At step S902, the processor may demap the signal based on the communication method used as would be understood by one of ordinary skill in the art. At step S904, the filter coefficients are initialized. At step S906, the filter coefficients are updated using the methodologies described in FIGS. 7 and 8. At step S908, the processor 2308 may check whether the stopping criteria is satisfied. For example, the processor 2308 may check whether a maximum number of iterations is reached or whether a global minimum is reached. In response to determining that the stopping criteria is satisfied, the flow goes to step S910. At step S910, the equalizer 322 filters the signal using the filter coefficients. In response to determining that the stopping criteria is not satisfied, the flow goes back to step S906.

In one example, the signal is then demodulated and decoded to recreate an original signal. Then, in an uplink transmission system, the recreated signal may be retransmitted by the base station 200 to other wireless devices. In one example, the signal may be forwarded to a destination node.

To illustrate the capabilities of the methodologies described herein, exemplary results are presented.

To test the effectiveness of the PSO algorithm when applied to a DFE for the SISO case, two time invariant channels are considered. A first channel C1=[1, −1.9114, 0.95] has an eigenvalue spread of 635 and a second channel C2=[0.408, 0.816, 0.408] has an eigenvalue spread of 200. The length of the feedforward and feedback filters are 4 and 2, respectively. BPSK (Binary phase-shift keying) modulation is assumed. For the MIMO case, the channels $h_{11}$, $h_{12}$, $h_{21}$, and $h_{22}$, are taken as three-path Rayleigh i.e. the impulse response is three delta functions which are assumed to fade independently and the length of the feedforward and feedback filters are 8 and 5, respectively. The product of Doppler frequency, $f_d$, and the sampling time, $T_s$, is taken as $f_d T_s$=0.0001 and the modulation scheme is QPSK (Quadrature phase shift keying). The additive white Gaussian noise is selected with a signal to noise ratio of 20 dB.

To have near optimum performance, a careful selection of the key parameters is needed. Towards this goal, experiments have been performed to find the values of 5 key parameters that give minimum MSE, namely the data block size N, the population size n, the maximum velocity $v_{max}$, the acceleration constants $c_1$ and $c_2$, and finally, the limits $k_{min}$ and $k_{max}$ of the iteration-dependent factor $k_c$ which directly controls the constriction factor K. The analysis showed that these parameters do not depend on the modulation type, channel or number of transmit and receive antennas. Hence, once these parameters are adjusted, they are held fixed for any kind of modulation scheme or channel and for any number of transmit and receive antennas. Thus, the key parameters value may be stored in the memory of the receiver 104.

Figure 10:
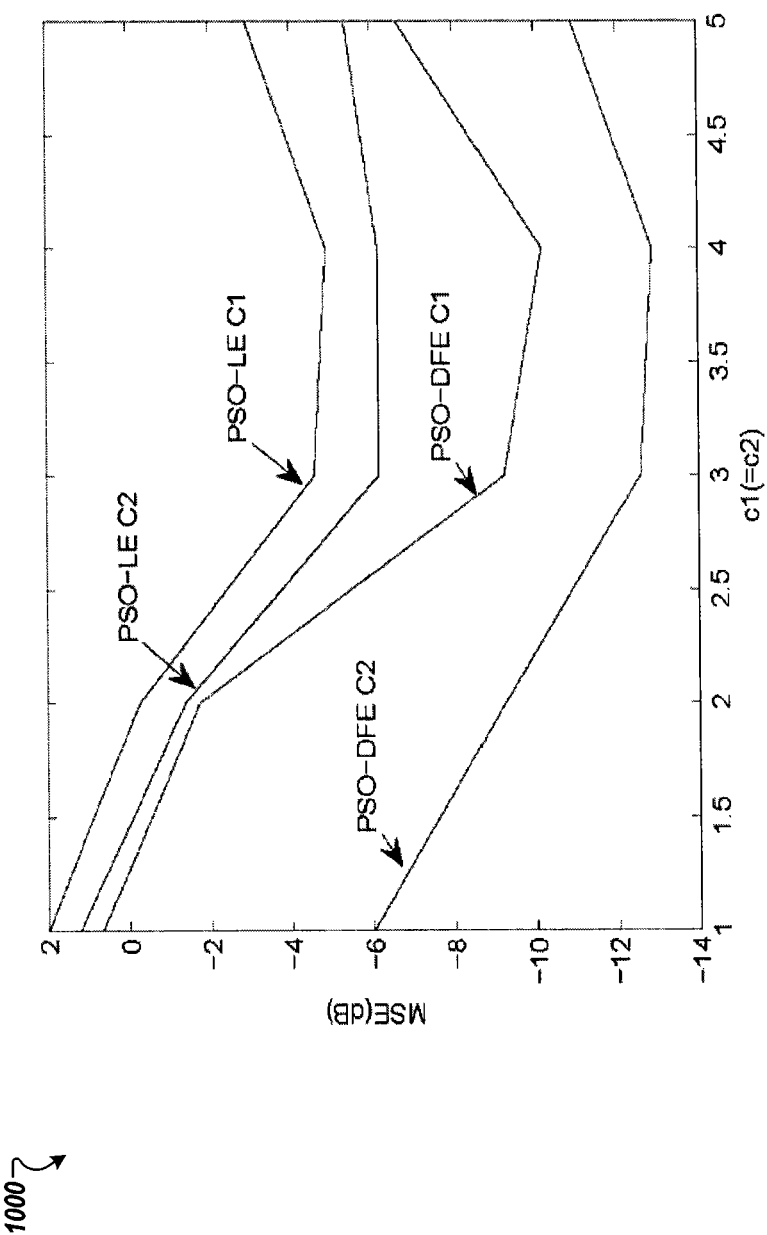
FIG. 10 is a graph that shows the effect of varying acceleration constants according to one example.

FIG. 10 is a graph 1000 that shows the effect of varying acceleration constants on the MSE according to one example. Equal values of $c_1$ and $c_2$ are used to achieve a balance between the local and global searches. The MSE is shown for a plurality of c1 values. For c1=4 the best results are achieved, as shown in FIG. 10.

Figure 11:
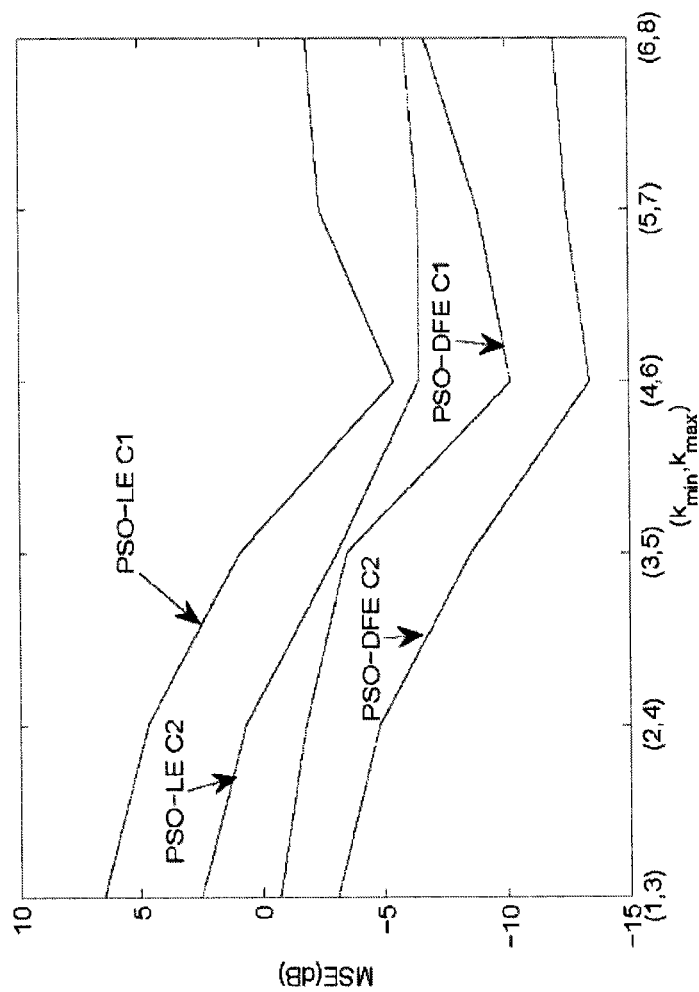
FIG. 11 is a graph that shows the effect of the limits of the iteration-factor on the Mean Square Error (MSE) according to one example.

FIG. 11 is a graph 1100 that shows the effect of the limits of the iteration-factor on the MSE according to one example. With respect to the limits $k_{min}$ and $k_{max}$, the optimum value achieved is $k_{min}$=4 and $k_{max}$=6 as shown in FIG. 11.

Figure 12:
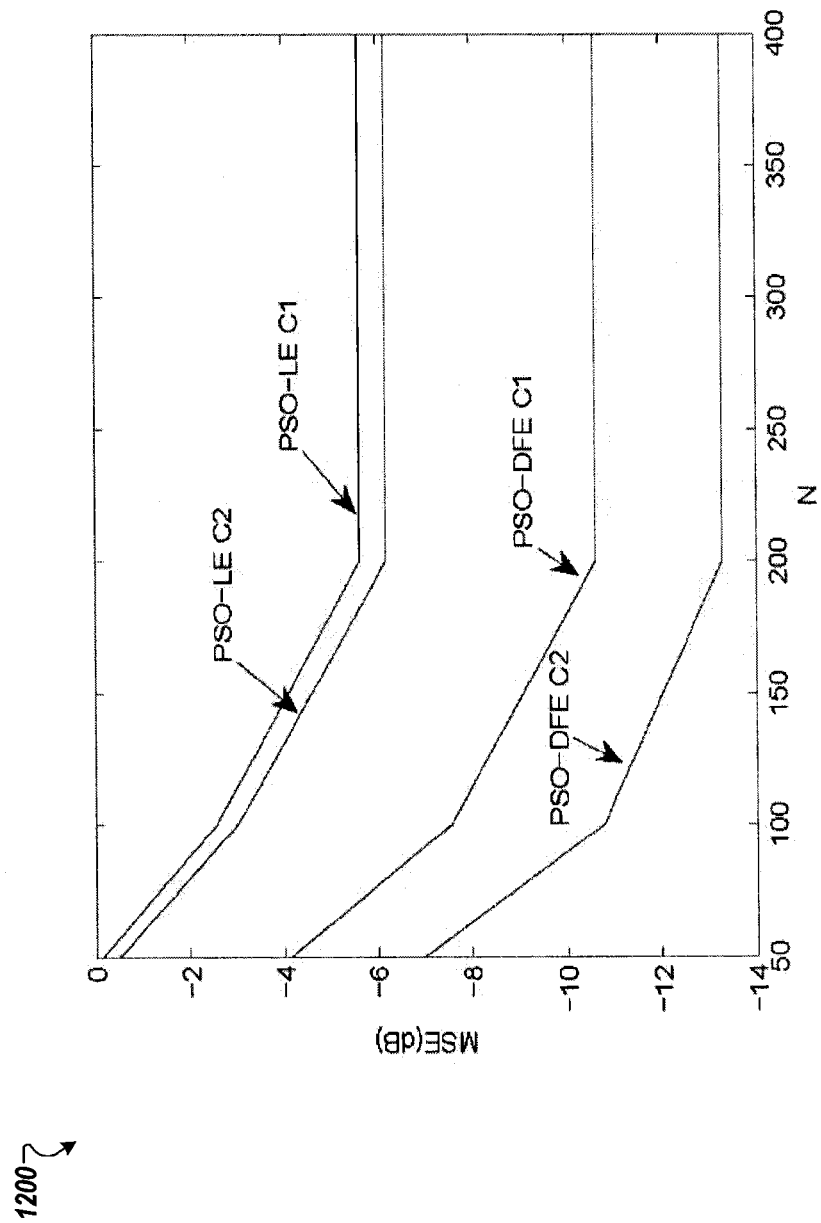
FIG. 12 is a graph that shows the effect of the block size on the MSE according to one example.

FIG. 12 is a graph 1200 that shows the effect of the block size on the MSE according to one example. As shown in FIG. 12, no improvement in the MSE is obtained for a block size larger than N=200.

Figure 13:
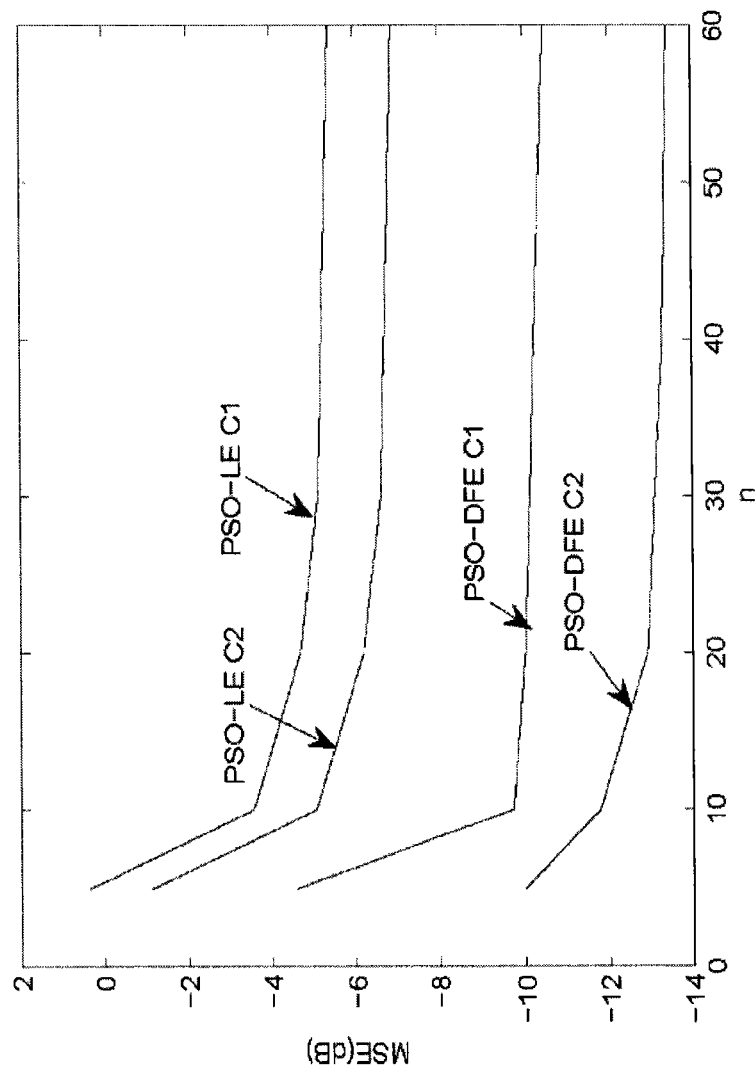
FIG. 13 is a graph that shows the effect of the number of particles on the MSE according to one example.

FIG. 13 is a graph 1300 that shows the effect of the number of particles on the MSE according to one example. In general, a large population size provides fast convergence but there is no significant improvement beyond n=40, as shown in FIG. 13.

Figure 14:
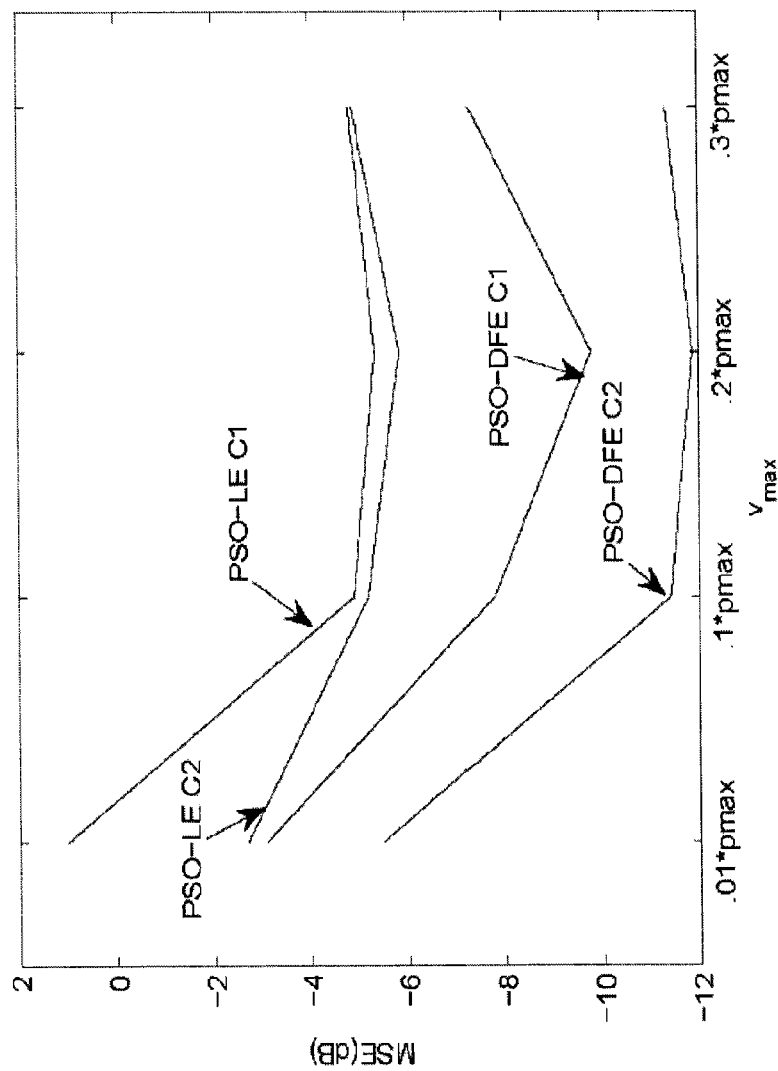
FIG. 14 is a graph that shows the effect of the maximum velocity and the maximum position on the MSE according to one example.

FIG. 14 is a graph 1400 that shows the effect of the maximum velocity on the MSE according to one example. FIG. 14 shows that within the range of $[0.01 \cdot p_{max}, 0.3 \cdot p_{max}]$, the maximum velocity of $v_{max}$=0.2·$p_{max}$ is the one that leads to the lowest MSE.

For PSO-LMS, all the parameters are the same and only n=5 is used since n>5 does not give significant performance gain. The different parameters comprising the PSO algorithm have to be selected using a sensitivity analysis, during the training phase similar to the one described above, to be able to select the compromised one.

The learning and Symbol Error Rate (SER) curves, described herein, are obtained for $p_{max}=2$, and $p_{min}=-2$, and the MSE is averaged over 20 runs. For comparison, block LMS/RLS with a step-size µ of 0.025 is used.

Figure 15:
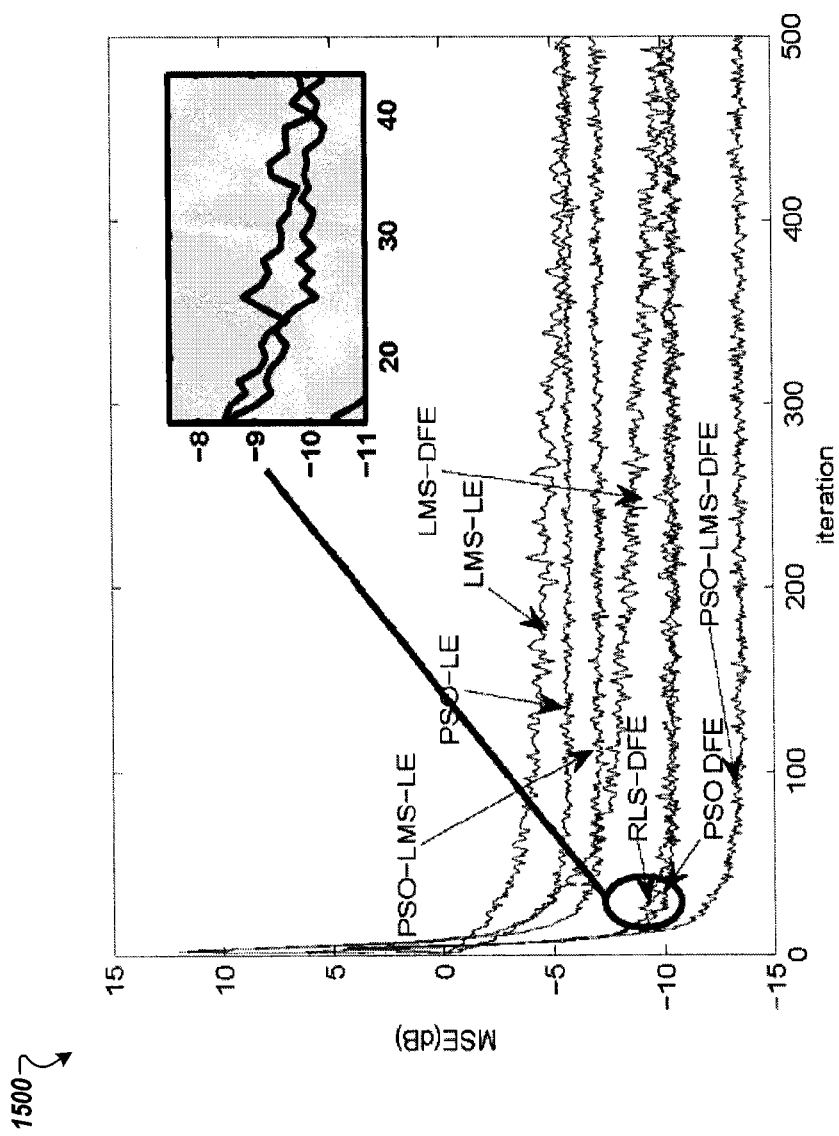
FIG. 15 is a graph that shows the learning curves of a plurality of algorithms for channel equalization for a first channel according to one example.

FIG. 15 is a graph 1500 that shows the learning curves of a plurality of algorithms for channel equalization for the first channel according to one example. Graph 1500 shows the learning curves for the following algorithms: LMS-LE, LMS-DFE, PSO-LE, PSO-LMS-LE, RLS-DFE, PSO-DFE, and PSO-LMS-DFE. The insensitivity of the PSO-DFE to the channel's eigenvalue spread is clear from FIG. 15.

Figure 16:
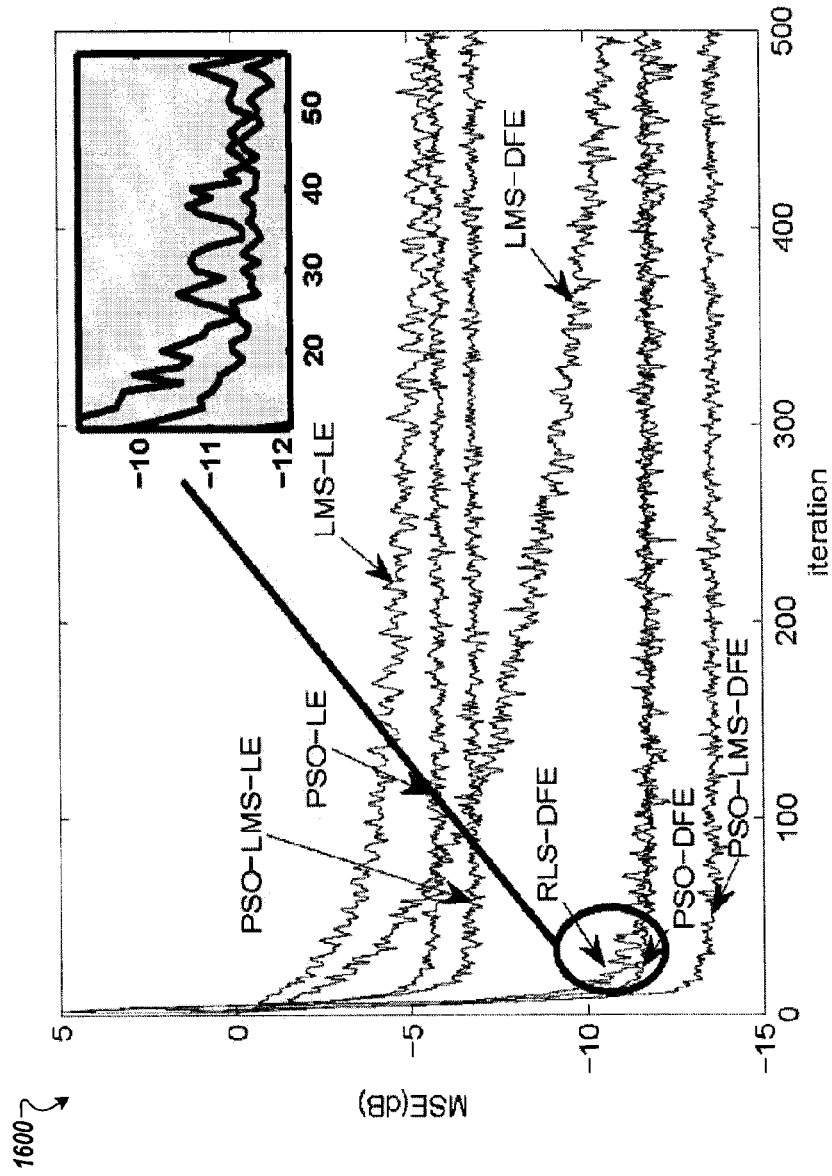
FIG. 16 is a graph that shows the learning curves of a plurality of algorithms for channel equalization for a second channel according to one example.

FIG. 16 is a graph 1600 that shows the learning curves of the plurality of algorithms for channel equalization for the second channel according to one example. Graph 1600 shows the learning curves for the plurality of algorithms for the second channel C2. The insensitivity of the PSO-DFE to the channel's eigenvalue spread is clear from FIG. 16.

Figure 17:
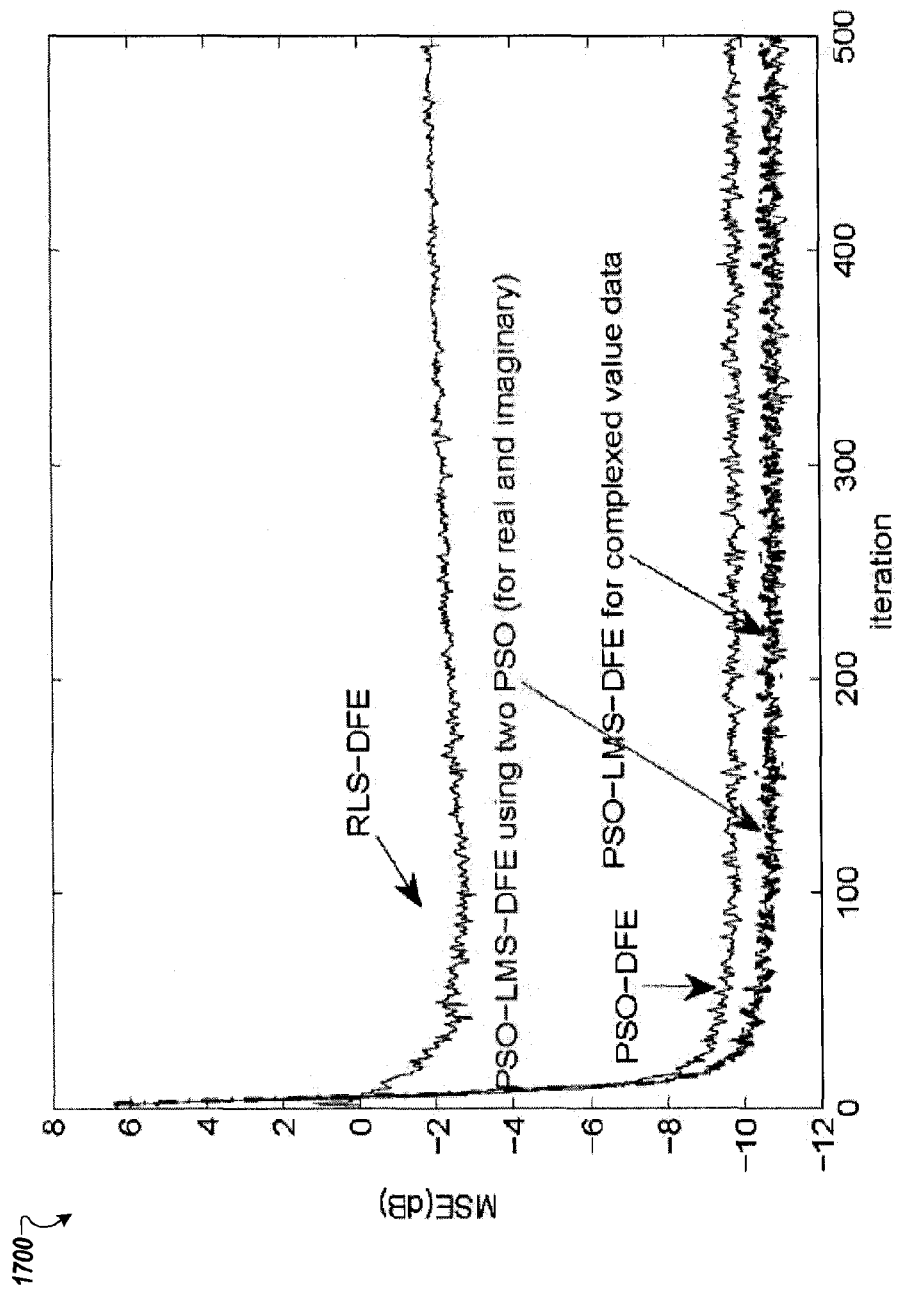
FIG. 17 is a graph that shows the learning curves of a plurality of algorithms for channel equalization of a MIMO channel according to one example.

FIG. 17 is a graph 1700 that shows the learning curves of the plurality of algorithms for channel equalization of a MIMO channel according to one example. The improvement in convergence time and MSE is more pronounced in the MIMO channel which has larger eigenvalue spread as shown in graph 1700. Graph 1700 shows that the modified PSO-LMS-DFE for complex-valued data and the PSO-LMS-DFE using two PSOs for real and imaginary part separately have equal performance.

An improvement in convergence time and steady state MSE are achieved by the PSO-DFE over the PSO-LE and LMS/RLS. It is also clear that PSO-LMS-DFE performs better than PSO-DFE.

Figure 18:
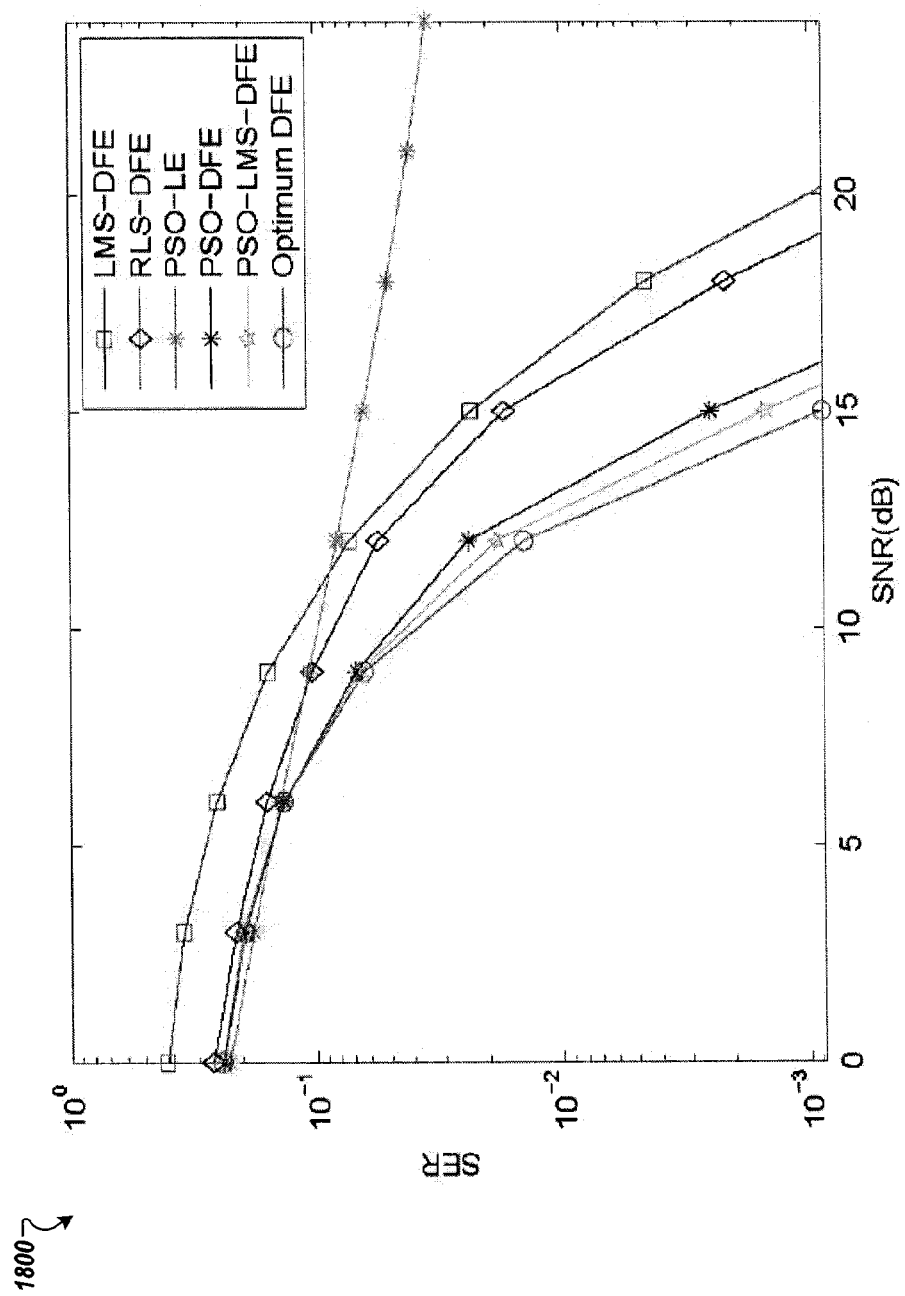
FIG. 18 is a graph that shows the symbol error rate for the first channel according to one example.

FIG. 18 is a graph 1800 that shows the symbol error rate for the first channel according to one example. Graph 1800 shows a plurality of traces showing the symbol error rate for the first channel as a function of the SNR for the plurality of algorithms.

Figure 19:
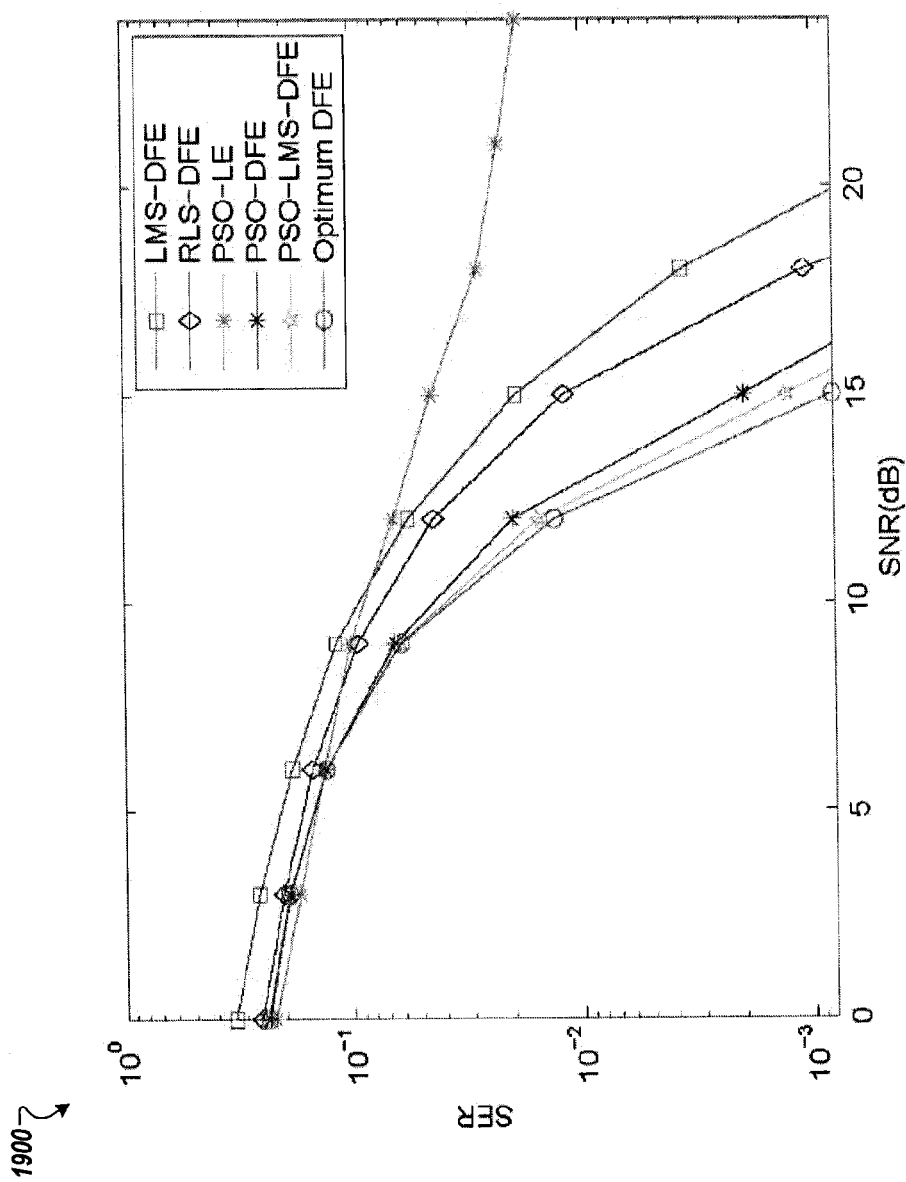
FIG. 19 is a graph that shows the symbol error rate for the second channel according to one example.

FIG. 19 is a graph 1900 that shows the symbol error rate for the second channel according to one example. Graph 1900 shows a plurality of traces showing the symbol error rate for the second channel as a function of the SNR for the plurality of algorithms.

Figure 20:
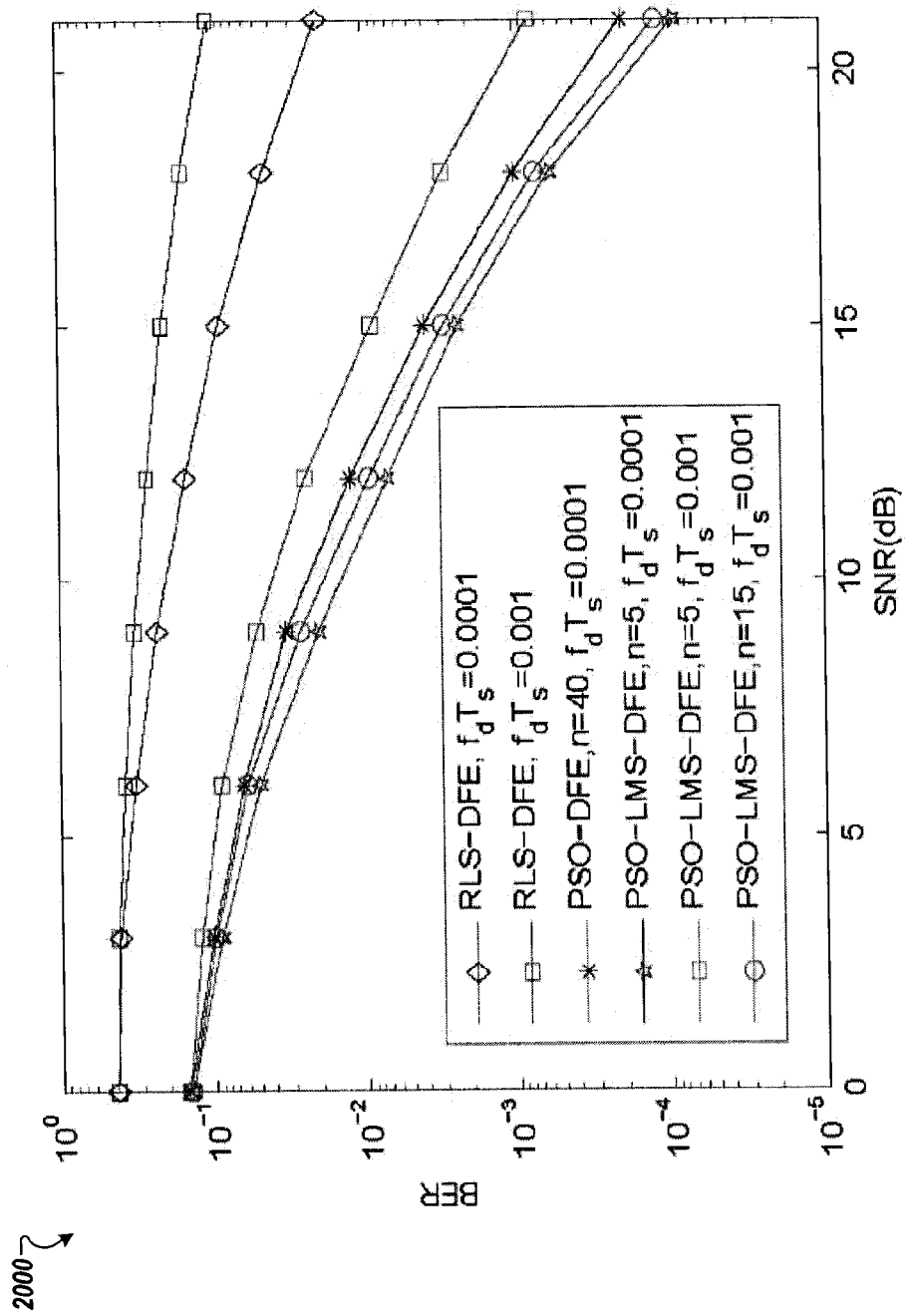
FIG. 20 is a graph that shows the symbol error rate for MIMO channel according to one example.

FIG. 20 is a graph 2000 that shows the symbol error rate for MIMO channel according to one example. Graph 2000 shows a plurality of traces showing the symbol error rate for the MIMO channel as a function of the SNR for the plurality of algorithms.

FIGS. 18, 19 and 20 show that the PSO-DFE achieves significantly lower SER than PSO-LE and LMS/RLS and its performance is very close to that of an ideal DFE (with perfect channel knowledge) even when the channel eigenvalue spread is large. Due to the fast convergence of PSO, less training symbols are required and hence a great reduction in the throughput overhead. However, these benefits are achieved at a slight increase in the computational complexity. The PSO-LMS-DFE performance is even closer to the optimum DFE and its complexity is less than that of the PSO-DFE, as described further below. Further, the impact of the number of particles on the performance of the PSO-LMS-DFE algorithm is depicted in FIG. 20. As shown in FIG. 20, by increasing the swarm size, the performance of the PSO-LMS-DFE improves very well. This is due to the fact that the number of particles has a great impact on the search space. As the number of particles increases, particles cover all the search space and therefore, PSO easily finds the potential solution in a time varying environment.

The PSO has an advantage over the block RLS of avoiding the matrix inversion operation to update the weights of the equalizer. For complexity analysis of PSO, the total number of complex additions and complex multiplications per iteration may be analyzed for the SISO case. Considering the PSO with a variable constriction factor operating on complex data.

The velocity update may require three complex multiplications and four complex additions per particle per dimension. Multiplication with $c_1$ and $c_2$ in the velocity update equation is ignored as $c_1=c_2=4$, which can easily be implemented using shift registers. Hence, for n particles of d dimensions each, 3dn complex multiplications and 5dn complex multiplications may be required to update the velocity.

Then, computing the constriction factor amounts to three complex multiplications and three complex additions ignoring the calculations due to the terms $\Phi$, $|1-\Phi-\sqrt{\Phi^2-4\Phi}|$, and $(k_{max}-k_{min})$ as these can be calculated off-line. Calculations due to constriction factor may be ignored in this analysis as it can be saved in a lookup table. Thus, in one example, the construction factor may be stored in the memory 2310. In addition, the particle update requires one complex addition.

Computing the output vector of the equalizer for each particle may require dNn complex multiplication and (d−1) Nn complex additions for a block of size N Further Nn complex additions may be required to calculate the error signal.

Evaluation of the MSE, as expressed in Equation (19), requires (N−1)n complex additions. The computations to calculate the square of error may be ignored because PSO compares the MSE due to all the particles and picks the one that achieves the minimum MSE so the same results can be obtained by using mean error instead of MSE.

The PSO with variable constriction factor for complex valued signals requires dNn+3dn+3 complex multiplications and (d−1)Nn+5dn+3+(N−1)n+Nn=dNn+5dn+3+(N−1)n complex additions per iteration. For the PSO-LMS, the algorithm switches between PSO and LMS. The LMS requires 2dN complex multiplications and (d−1)N+2d complex additions per particle as described in A. H. Sayed, Fundamentals of Adaptive Filtering, New York, Wiley, 2003. Extensive simulations have been performed to calculate the number of updates using the LMS update equation during the whole run and it has been observed that the algorithm uses the LMS update equation for 75 out of 100 iterations on an average. Therefore, the PSO-LMS requires 0.75(2dNn)+0.25(dNn+3dn+3) complex multiplications and 0.75((d−1)N+2d)n+0.25(dNn+5dn+3+(N−1)n) complex additions per iteration. As can be seen, complexity depends on the number of particles, which are greatly reduced in PSO-LMS. Using N=200, d=6, and n=40 for PSO (n=5 for PSO-LMS), the PSO-LMS is 5 times faster than PSO in terms of multiplications and 10 times faster in terms of additions.

The convolution operation required to compute the output of the equalizer, can be performed in the frequency-domain using an overlap-save method. The overlap-save method further reduces the complexity of PSO-LMS. In addition, rather than updating the parameters of PSO-LMS in the time-domain, they can be adapted in the frequency-domain. The PSO-LMS algorithm so implemented is referred to as fast PSO-LMS and it requires three M-point FFT (IFFT) as done for fast LMS, where M=2N and N=d. Each M-point FFT (IFFT) requires $(M/2)\log_2 M$ complex multiplications and $M\log_2 M$ complex additions. The computation of frequency-domain output vector of equalizer for each particle requires Mn complex multiplications and (M−1)n complex additions. Hence, the total number of complex multiplications and additions for fast PSO-LMS becomes $0.75(2Mn+3(M/2)\log_2 M)+0.25(Mn+3(M/2)\log_2 M+3Mn+3)$ and $0.75(((M-1)+M)n+3M\log_2 M)+0.25((M-1)n+3M\log_2 M+5Mn+3+(M-1)n+Mn)$ per iteration respectively. For M=512 and d=N, fast PSO-LMS is 156 times faster than PSO in terms of multiplications and 92 times faster in terms of additions.

Figure 21:
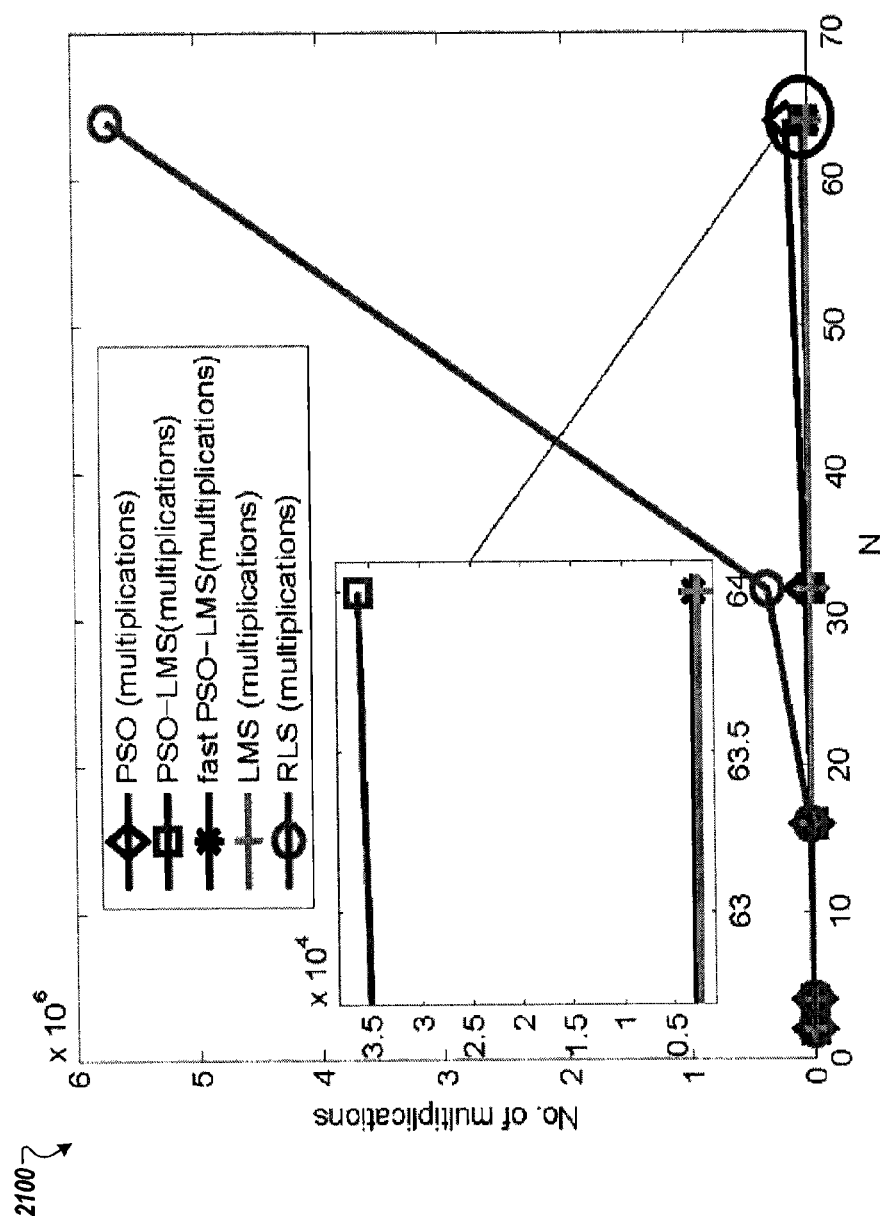
FIG. 21 is a graph that shows computational variations with the block size according to one example.
Figure 22:
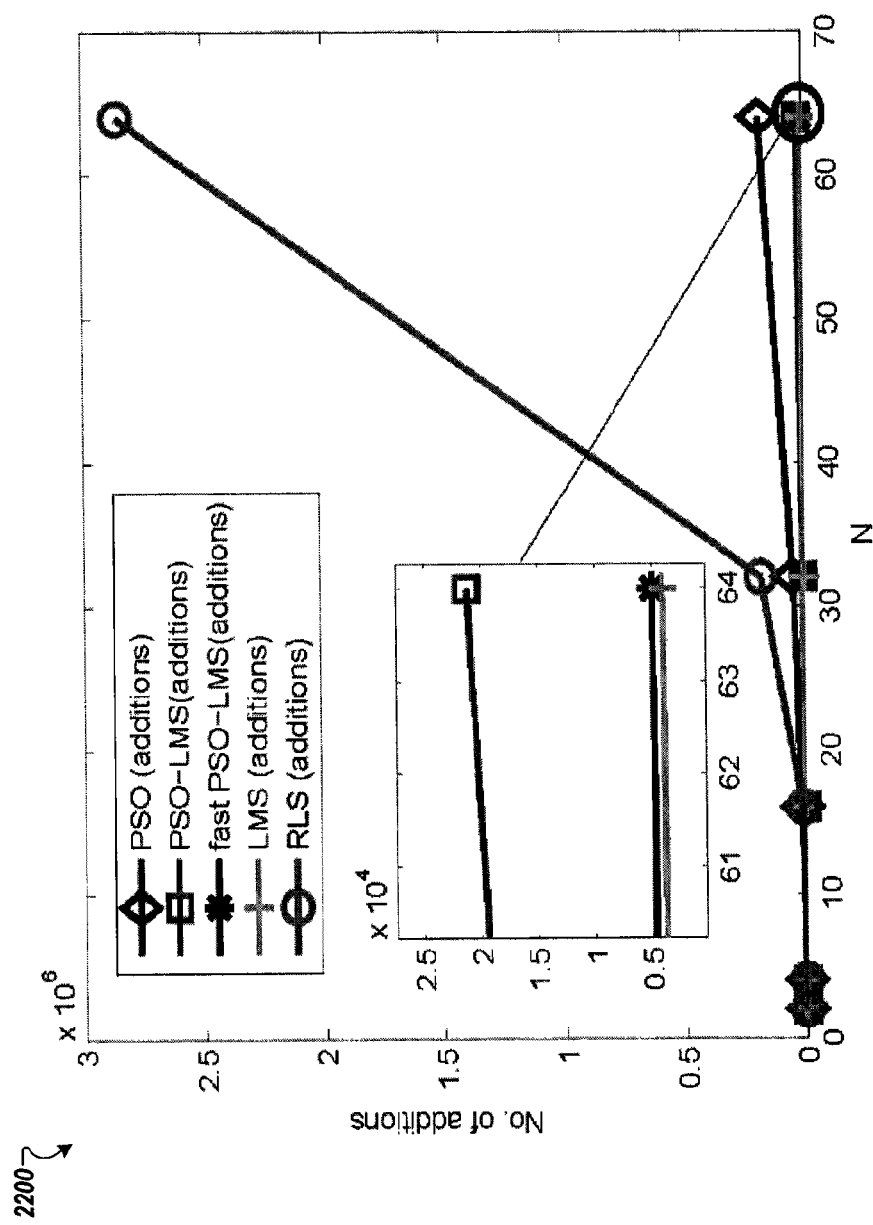
FIG. 22 is a graph that shows computational variations with the block size according to one example.

Table 1 summarizes the computational complexity of the different algorithms and FIGS. 21 and 22 depict the comparison.

FIG. 21 is a graph 2100 that shows computational variations with the block size according to one example. Graph 2100 shows the number of multiplications as a function of the block size for the plurality of algorithms.

FIG. 22 is a graph 2200 that shows computational variations with the block size according to one example. Graph 2200 shows the number of additions as a function of the block size for the plurality of algorithms.

From FIGS. 21 and 22, it can be seen that the size of N has a great impact on the computational complexity of the different algorithms. Note that in the case of the RLS algorithm, the number of multiplications required for matrix inversion is estimated using the approach described in G. H. Golub and C. F. Van Loan, Matrix computations, Johns Hopkins University Press, 4$^{th}$ ed., 2013.

TABLE 1

Computational complexity of different PSO algorithms

| Algorithm | Multiplications | Additions |
|---|---|---|
| PSO | $dNn + 3dn + 3$ | $dNn + 5dn + 3 + (N − 1)n$ |
| PSO-LMS | $3dn/4 + Ndn/4 + 3/4$ | $11dn/4 − Nn/2 − n/4 + Ndn + 3/4$ |
| Fast PSO-LMS | $5Mn/2 + (M/2)\log_2 M + 3/4$ | $7Mn/2 − 5n/4 + 3(M/2)\log_2 M + 3/4$ |

FIG. 23 is a block diagram representation of the receiver 104 according to one example. The receiver 104 may include an antenna 2300, reception circuitry 2302, the equalizer 322, a demodulator 2304, a processor 2308, a memory 2310, and a bus 2318. The receiver 104 may be part of the base station 200. At the base station 200, the reception circuitry 2302 may receive an RF signal from the antenna 2300. The reception circuitry 2302 may also receive other types of signals such as microwave, optical, or the like. The base station 200 may include a plurality of antennas. The reception circuitry 2302 provides the RF signal to the equalizer 322. The equalizer 322 may use any of the equalization techniques described above to provide the output samples to the demodulator 2304. The demodulator 2304 process the output samples and provides symbol estimates to the processor 2308. The processor 2308 process the symbol estimates and provides decoded data. The memory 2310 may store data and program code for the receiver 104. The memory 2310 may store past data performance, noise level, number of particles used, and filter coefficients. The equalizer 322, the demodulator 2304, the processor 2308, and the memory 2310 are connected to each other by the bus 2318. The antenna 2300 receives electromagnetic wave signals between base stations, mobile devices, for performing radio-based communication, such as the various forms of cellular telephone communication. The processor 2308 may be a Xenon® or Core™ processor from Intel® of America or an Opteron™ processor from AMD of America, or may be other processor types that would be recognized by one of ordinary skill in the art. Alternatively, the processor 2308, and the equalizer 322 may be implemented on an FPGA, ASIC, PLD or using discrete logic circuits, as one of ordinary skill in the art would recognize.

Figure 24:
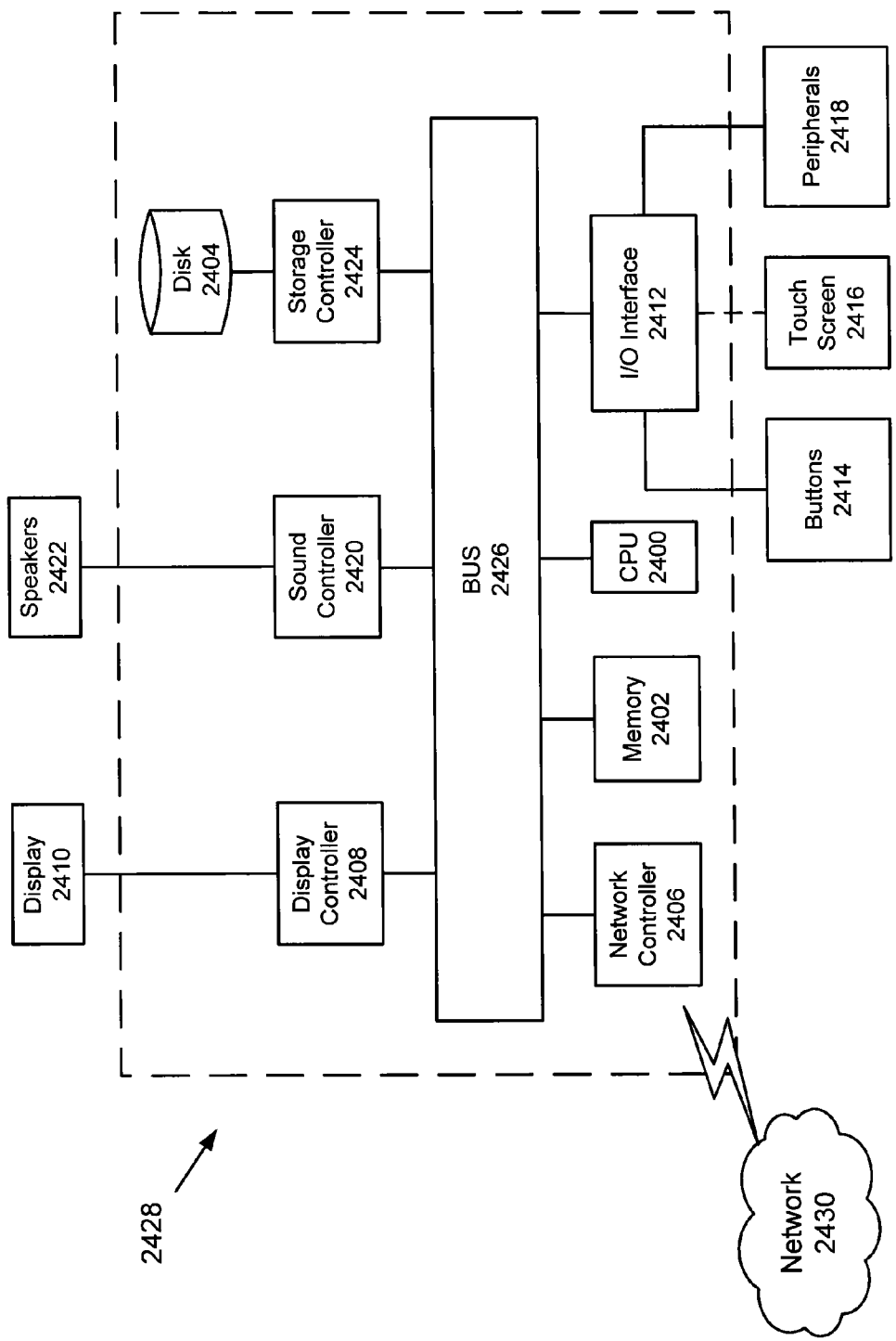
FIG. 24 is an exemplary block diagram of a computer according to one example.

FIG. 24 is a block diagram showing an example of a hardware configuration of a computer that can be configured to perform functions of any one or a combination of reception apparatus and transmission apparatus. For example, in one embodiment, the computer is configured to perform the functions in the digital domain such as the transmitter 100 or the receiver 104.

Next, a hardware description of the computer according to exemplary embodiments is described with reference to FIG. 24. In FIG. 24, the computer 2428 includes a CPU 2400 which performs the processes described herein. The process data and instructions may be stored in memory 2402. These processes and instructions may also be stored on a storage medium disk 2404 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 2428 communicates, such as a server or computer.

Further, the claimed advancements may be provided as a utility application, background daemon, or component of an operating system, or combination thereof, executing in conjunction with CPU 2400 and an operating system such as Microsoft® Windows®, UNIX®, Oracle® Solaris, LINUX®, Apple macOS™ and other systems known to those skilled in the art.

Figure 25:
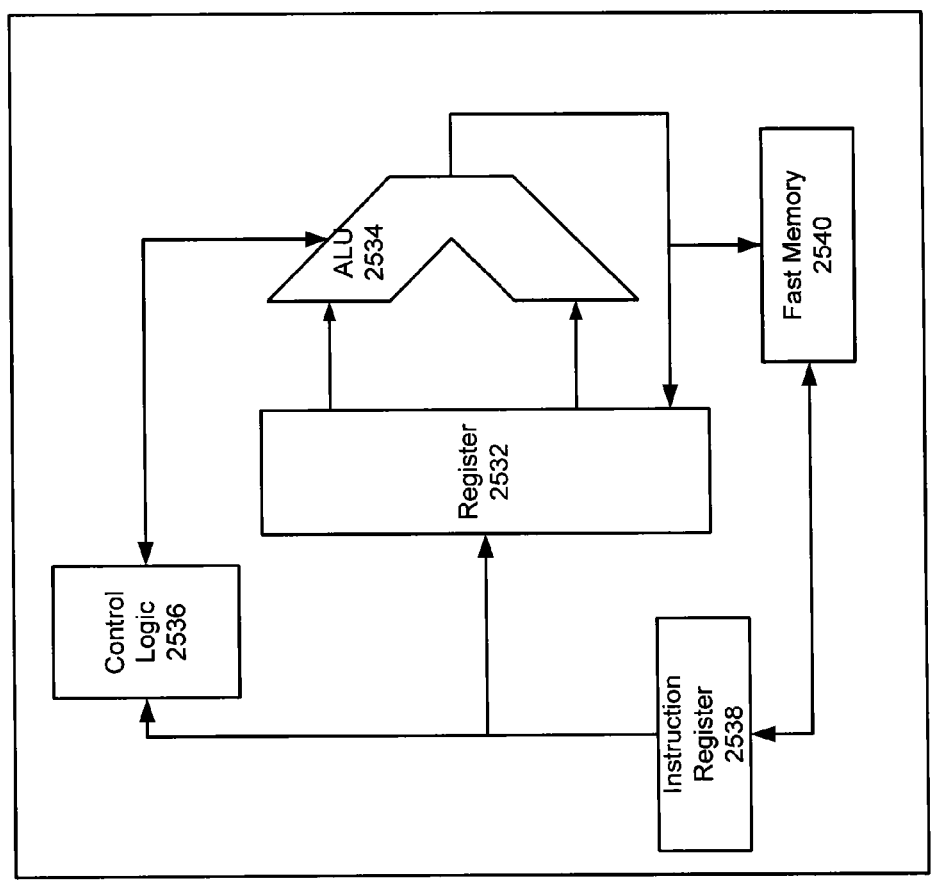
FIG. 25 is an exemplary block diagram of a central processing unit according to one example.

In order to achieve the computer 2428, the hardware elements may be realized by various circuitry elements. For example, CPU 2400 may be a Xenon or Core processor from Intel of America or an Opteron processor from AMD of America, or may be other processor types that would be recognized by one of ordinary skill in the art. Alternatively, the CPU 2400 may be implemented on an FPGA, ASIC, PLD or using discrete logic circuits, as one of ordinary skill in the art would recognize. Further, CPU 2400 may be implemented as multiple processors cooperatively working in parallel to perform the instructions of the inventive processes described above. For example, FIG. 25 shows one implementation of CPU 2400.

The computer 2428 in FIG. 24 also includes a network controller 2406, such as an Intel Ethernet PRO network interface card from Intel Corporation of America, for interfacing with network 2430. As can be appreciated, the network 2430 can be a public network, such as the Internet, or a private network such as LAN or WAN network, or any combination thereof and can also include PSTN or ISDN sub-networks. The network 2430 can also be wired, such as an Ethernet network, or can be wireless such as a cellular network including EDGE, 3G and 4G wireless cellular systems. The wireless network can also be WiFi®, Bluetooth®, or any other wireless form of communication that is known.

The computer 2428 further includes a display controller 2408, such as a NVIDIA® GeForce® GTX or Quadro® graphics adaptor from NVIDIA Corporation of America for interfacing with display 2410, such as a Hewlett Packard® HPL2445w LCD monitor. A general purpose I/O interface 2412 interfaces with a keyboard and/or mouse 2414 as well as an optional touch screen panel 2416 on or separate from display 2410. General purpose I/O interface also connects to a variety of peripherals 2418 including printers and scanners, such as an OfficeJet® or DeskJet® from Hewlett Packard.

A sound controller 2420 is also provided in the computer 2428, such as Sound Blaster® X-Fi Titanium® from Creative, to interface with speakers/microphone 2422 thereby providing sounds and/or music.

The general purpose storage controller 2424 connects the storage medium disk 2404 with communication bus 2426, which may be an ISA, EISA, VESA, PCI, or similar, for interconnecting all of the components of the computer 2428. A description of the general features and functionality of the display 2410, keyboard and/or mouse 2414, as well as the display controller 2408, storage controller 2424, network controller 2406, sound controller 2420, and general purpose I/O interface 2412 is omitted herein for brevity as these features are known.

In one implementation of CPU 2400, the instruction register 2538 retrieves instructions from the fast memory 2540. At least part of these instructions are fetched from the instruction register 2538 by the control logic 2536 and interpreted according to the instruction set architecture of the CPU 2400. Part of the instructions can also be directed to the register 2532. In one implementation, the instructions are decoded according to a hardwired method, and in another implementation, the instructions are decoded according a microprogram that translates instructions into sets of CPU configuration signals that are applied sequentially over multiple clock pulses. After fetching and decoding the instructions, the instructions are executed using the arithmetic logic unit (ALU) 2534 that loads values from the register 2532 and performs logical and mathematical operations on the loaded values according to the instructions. The results from these operations can be feedback into the register and/or stored in the fast memory 2540.

The present disclosure is not limited to the specific circuit elements described herein, nor is the present disclosure limited to the specific sizing and classification of these elements.

The functions and features described herein may also be executed by various distributed components of a system. For example, one or more processors may execute these system functions, wherein the processors are distributed across multiple components communicating in a network. The distributed components may include one or more client and server machines, which may share processing in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

The hardware description above, exemplified by any one of the structure examples shown in FIG. 23 or 24, constitutes or includes specialized corresponding structure that is programmed or configured to perform the algorithms shown in FIGS. 4, 7, 8, and 9.

A method which includes the features in the foregoing description provides numerous advantages to users.

PSO is integrated with the DFE structure to obtain a superior performance of the PSO-DFE with respect to the widely-used LMS/RLS-DFE. This improvement is more pronounced for highly-dispersive channels with large eigen-value spread and MIMO channels. The PSO-DFE significantly outperforms the PSO-LE and the LMS/RLS-DFE in terms of convergence time and steady-state MSE. A hybrid algorithm, PSO-LMS-DFE, is also disclosed which is not only superior to the PSO-DFE in terms of performance but also have lower complexity. Hybridizing PSO with other algorithms, such that described in M. Mnrlinez-Ramdn, J. Arenas-Garcia, A. Navia-Vhquez, and A. R. Figueiras-Vidal, "An adaptive combination of adaptive filters for plant identification," le International Conference on Digital Signal Processing, pp. 1195-1198, 2002, can be used. Further complexity reduction is achieved using the FFT in the Fast PSO-LMS-DFE.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The above disclosure also encompasses the embodiments listed below.

(1) A method for channel equalization in a communication system, the method includes initializing, using processing circuitry, filter coefficients of an adaptive decision feedback equalizer randomly in a predetermined search space; updating, using the processing circuitry, the filter coefficients, wherein in response to determining that the filter coefficients are stagnant, the filter coefficients are updated using a least mean square recursion, and wherein in response to determining that the filter coefficients are not stagnant, the filter coefficients are updated using a particle swarm optimization procedure; repeating the updating step until a predetermined stopping criteria is met; and filtering, using the processing circuitry, a received signal based on the filter coefficients.

(2) The method of feature (1), wherein the least mean square update equation is a function of a step size, an error value, an input matrix, and a decision matrix.

(3) The method of feature (1) or (2), wherein updating the filter coefficients using the least mean square recursion includes applying $$p_{i,k+1} = p_{i,k} + \mu A_k^T e_i(k)$$

where $\mu$ is the step size, e is an error value, and $$A_k = \begin{bmatrix} Y_k^H \\ D_k^H \end{bmatrix}$$

where Y is an input matrix, and D is a decision matrix.

(4) The method of any one of features (1) to (3), wherein determining whether the filter coefficient are stagnant includes comparing current values of the filter coefficients with previously determined values of the filter coefficients.

(5) The method of any one of features (1) to (4), further including updating the filter coefficients as a function of a velocity update equation, wherein the velocity update equation is a function of an inertia weight, a first acceleration rate, and a second acceleration rate.

(6) The method of feature (5), wherein the velocity update equation includes a constriction factor.

(7) The method of any one of features (1) to (6), wherein the communication system is a multiple input-multiple output communication system.

(8) The method of any one of features (1) to (7), in which the filter coefficients are complex numbers.

(9) The method of any one of features (1) to (8), in which the particle swarm optimization procedure includes optimizing an objective function, the objective function being minimized in order to optimize the filter coefficients.

(10) An apparatus for channel equalization in a communication system, the apparatus including processing circuitry configured to initialize filter coefficients of an adaptive decision feedback equalizer randomly in a predetermined search space, update the filter coefficients, wherein in response to determining that the filter coefficients are stagnant, the filter coefficients are updated using a least mean square recursion, and wherein in response to determining that the filter coefficients are not stagnant, the filter coefficients are updated using a particle swarm optimization procedure, repeat the updating step until a predetermined stopping criteria is met, and filter a received signal based on the filter coefficients.

(11) The apparatus of feature (10), in which the least mean square update equation is a function of a step size, an error value, an input matrix, and a decision matrix.

(12) The apparatus of feature (10) or (11), in which the processing circuitry updates the filter coefficients using the least mean square recursion by applying $$p_{i,k+1} = p_{i,k} + \mu A_k^T e_i(k)$$

where $\mu$ is the step size, e is an error value, and $$A_k = \begin{bmatrix} Y_k^H \\ D_k^H \end{bmatrix}$$

where Y is an input matrix, and D is a decision matrix.

(13) The apparatus of any one of features (10) to (12), in which the processing circuitry determines whether the filter coefficient are stagnant by comparing current values of the filter coefficients with previously determined values of the filter coefficients.

(14) The apparatus of any one of features (10) to (13), in which the processing circuitry is further configured to update the filter coefficients as a function of a velocity update equation, wherein the velocity update equation is a function of an inertia weight, a first acceleration rate, and a second acceleration rate.

(15) The apparatus of feature (14), in which the velocity update equation includes a constriction factor.

(16) The apparatus of any one of features (10) to (15), in which the communication system is a multiple input-multiple output communication system.

(17) The apparatus of any one of features (10) to (16), in which the filter coefficients are complex numbers.

(18) The apparatus of any one of features (10) to (17), in which the particle swarm optimization procedure includes optimizing an objective function, the objective function being minimized in order to optimize the filter coefficients.

(19) A non-transitory computer readable medium storing computer-readable instructions therein which when executed by a computer cause the computer to perform the method of any one of features (1) to (9).

The invention claimed is:

1. A method for channel equalization in a communication system, the method comprising:
   initializing, using processing circuitry, filter coefficients of an adaptive decision feedback equalizer randomly in a predetermined search space;
   updating, using the processing circuitry, the filter coefficients, wherein in response to determining that the filter coefficients are stagnant, the filter coefficients are updated using a least mean square recursion, and wherein in response to determining that the filter coefficients are not stagnant, the filter coefficients are updated using a particle swarm optimization procedure;
   repeating the updating step until a predetermined stopping criteria is met; and
   filtering, using the processing circuitry, a received signal based on the filter coefficients,
   wherein the updating the filter coefficients using the least mean square recursion includes applying $$p_{i,k+1} = p_{i,k} + \mu A_k^T e_i(k)$$

where $\mu$ is a step size, e is an error value, $$A_k = \begin{bmatrix} Y_k^H \\ D_k^H \end{bmatrix},$$

where Y is an input matrix, D is a decision matrix, $p_{i,k}$ is one of the filter coefficients, i is an index, and k is a time instant.

2. The method of claim 1, wherein the determining whether the filter coefficients are stagnant includes comparing current values of the filter coefficients with previously determined values of the filter coefficients.

3. The method of claim 1, further comprising: updating the filter coefficients as a function of a velocity update equation, wherein the velocity update equation is a function of an inertia weight, a first acceleration rate, and a second acceleration rate.

4. The method of claim 3, wherein the velocity update equation includes a constriction factor.

5. The method of claim 1, wherein the communication system is a multiple input-multiple output communication system.

6. The method of claim 1, wherein the filter coefficients are complex numbers.

7. The method of claim 1, wherein the particle swarm optimization procedure includes optimizing an objective function, the objective function being minimized in order to optimize the filter coefficients.

8. An apparatus for channel equalization in a communication system, the apparatus comprising:
   processing circuitry configured to
      initialize filter coefficients of an adaptive decision feedback equalizer randomly in a predetermined search space,
      update the filter coefficients, wherein in response to determining that the filter coefficients are stagnant, the filter coefficients are updated using a least mean square recursion, and wherein in response to determining that the filter coefficients are not stagnant, the filter coefficients are updated using a particle swarm optimization procedure, repeat the updating step until a predetermined stopping criteria is met, and filter a received signal based on the filter coefficients, wherein the updating of the filter coefficients using the least mean square recursion includes applying $$p_{i,k+1} = p_{i,k} + \mu A_k^T e_i(k)$$

where μ is a step size, e is an error value, $$A_k = \begin{bmatrix} Y_k^H \\ D_k^H \end{bmatrix},$$

where Y is an input matrix, D is a decision matrix, $p_{i,k}$ is one of the filter coefficients, i is an index, and k is a time instant.

9. The apparatus of claim 8, wherein the processing circuitry determines whether the filter coefficients are stagnant by comparing current values of the filter coefficients with previously determined values of the filter coefficients.

10. The apparatus of claim 8, wherein the processing circuitry is further configured to: update the filter coefficients as a function of a velocity update equation, wherein the velocity update equation is a function of an inertia weight, a first acceleration rate, and a second acceleration rate.

11. The apparatus of claim 10, wherein the velocity update equation includes a constriction factor.

12. The apparatus of claim 8, wherein the communication system is a multiple input-multiple output communication system.

13. The apparatus of claim 8, wherein the filter coefficients are complex numbers.

14. The apparatus of claim 8, wherein the particle swarm optimization procedure includes optimizing an objective function, the objective function being minimized in order to optimize the filter coefficients.

15. A non-transitory computer readable medium storing computer-readable instructions therein which when executed by a computer cause the computer to perform a method for channel equalization in a communication system, the method comprising:

initializing filter coefficients of an adaptive decision feedback equalizer randomly in a predetermined search space;

updating the filter coefficients, wherein in response to determining that the filter coefficients are stagnant, the filter coefficients are updated using a least mean square recursion, and wherein in response to determining that the filter coefficients are not stagnant, the filter coefficients are updated using a particle swarm optimization procedure;

repeating the updating step until a predetermined stopping criteria is met; and filtering a received signal based on the filter coefficients, wherein the updating the filter coefficients using the least mean square recursion includes applying $$p_{i,k+1} = p_{i,k} + \mu A_k^T e_i(k)$$

where μ is a step size, e is an error value, $$A_k = \begin{bmatrix} Y_k^H \\ D_k^H \end{bmatrix},$$

where Y is an input matrix, D is a decision matrix, $p_{i,k}$ is one of the filter coefficients, i is an index, and k is a time instant.

* * * * *